(12) United States Patent
Deng

(10) Patent No.: US 12,618,533 B2
(45) Date of Patent: May 5, 2026

(54) THREE-WIRE FLAT CABLE HIGH-VOLTAGE PLUG-IN LIGHT STRING AND METHOD OF MAKING THEREOF

(71) Applicant: Dongguan Yongfeng Lighting Co., Ltd, Dongguan City (CN)

(72) Inventor: Zhumei Deng, Dongguan City (CN)

(73) Assignee: Dongguan Yongfeng Lighting Co., Ltd Dongguan City, Dongguan City (CN)

( * ) Notice: Subject to any disclaimer, the term of this patent is extended or adjusted under 35 U.S.C. 154(b) by 0 days.

(21) Appl. No.: 19/267,228

(22) Filed: Jul. 11, 2025

(65) Prior Publication Data

US 2026/0117940 A1      Apr. 30, 2026

Related U.S. Application Data

(63) Continuation-in-part of application No. 18/929,586, filed on Oct. 28, 2024.

(51) Int. Cl.
| | |
|---|---|
| *F21K 9/90* | (2016.01) |
| *F21S 4/15* | (2016.01) |
| *F21V 17/14* | (2006.01) |
| *F21V 23/00* | (2015.01) |
| *F21V 23/06* | (2006.01) |
| *F21Y 115/10* | (2016.01) |
| *H05K 3/341* | (2026.01) |

(52) U.S. Cl.
CPC .................. *F21K 9/90* (2013.01); *F21S 4/15* (2016.01); *F21V 17/14* (2013.01); *F21V 23/001* (2013.01); *F21V 23/06* (2013.01);

*H05K 3/3421* (2013.01); *F21Y 2115/10* (2016.08); *H05K 2201/10628* (2013.01)

(58) Field of Classification Search
CPC .... F21K 9/90; F21S 4/15; F21V 17/14; F21V 23/001; F21V 23/06; H05K 3/3421; H05K 2201/10628; F21Y 2115/10
See application file for complete search history.

(56) References Cited

| | | |
|---|---|---|
| 4,899,266 A | 2/1990 | Ahroni |
| 5,622,425 A | 4/1997 | Lin |
| 8,567,992 B2 | 10/2013 | Lo et al. |

(Continued)

*Primary Examiner* — Tsion Tumebo
(74) *Attorney, Agent, or Firm* — Enable IP, P.C.

(57) ABSTRACT

A method of making a light string is disclosed. The method includes: providing a three-wire flat cable comprising a middle wire between two outer wires; cutting the middle wire at a first place to expose a first end and a second end of the middle wire; mounting a plurality of light sources onto a predetermined region of a circuit board, the circuit board comprising a first and a second exposed conductor contact pads positioned at a terminal end of the circuit board; applying phosphor materials over the mounted SMDs to create a luminous pattern; enclosing the circuit board in an encapsulation shell; fitting a light base over the terminal end of the circuit board enclosed in the encapsulation shell; solder the first end and second end of the middle wire to the first and the second exposed conductor contact pads contact pads, respectively; placing a light cover over the circuit board; affixing the light cover to a light base; and securing a decorative shell to a base portion of the light base to form a complete light assembly.

11 Claims, 35 Drawing Sheets

(56)  References Cited

U.S. PATENT DOCUMENTS

| | | | | |
|---|---|---|---|---|
| 9,655,211 | B2 | 5/2017 | Altamura et al. | |
| 10,568,172 | B2 * | 2/2020 | Li | C09K 11/77347 |
| 10,950,585 | B2 * | 3/2021 | Li | F21K 9/238 |
| 11,506,362 | B1 | 11/2022 | Wang et al. | |
| 11,867,368 | B1 * | 1/2024 | Ren | F21V 23/06 |
| 11,953,191 | B1 * | 4/2024 | Lam | F21K 9/90 |
| 12,055,275 | B1 | 8/2024 | Zou | |
| 12,338,959 | B1 * | 6/2025 | Chen | F21V 31/005 |
| 2004/0115984 | A1 | 6/2004 | Rudy et al. | |
| 2010/0226126 | A1 | 9/2010 | Naito et al. | |
| 2012/0217862 | A1 * | 8/2012 | Matsuda | F21K 9/232 |
| | | | | 313/46 |
| 2015/0003039 | A1 * | 1/2015 | Liu | F21K 9/00 |
| | | | | 362/382 |
| 2017/0167663 | A1 * | 6/2017 | Hsiao | F21K 9/237 |
| 2017/0363273 | A1 | 12/2017 | Chen | |
| 2018/0372278 | A1 * | 12/2018 | Zhang | F21K 9/237 |
| 2021/0140623 | A1 | 5/2021 | Yu | |
| 2024/0110694 | A1 | 4/2024 | Lam | |

* cited by examiner

Side View        Front View

Side View        Front View

Side View        Front View

Side View     Front View          Side View     Front View

1400

1404

1402     1406

1401

1400

1403

1401

1402  1404  1406

1400

1401

1403

1400

1401

Side View

Front View        Side View

Front View        Side View

Front View    Side View

Front View

Side View

3600

3600

2602

3602

Front View    Side View    Front View    Side View

3704

3704

3702    3702

3702    3702

3700

3700

Front View

Side View

Top View

Front View

Side View

Top View

Front View

Side View

Top View

Top View

Front View           Side View

Front View          Side View

Front View    Side View        Front View    Side View

4800

4802

4900

THREE-WIRE FLAT CABLE HIGH-VOLTAGE PLUG-IN LIGHT STRING AND METHOD OF MAKING THEREOF

FIELD

This relates to light strings, and more particularly, to a three-wire flat cable high-voltage plug-in light string and the method of making thereof.

BACKGROUND

Traditional processes of making light strings include a step of twisting the wires, which can add to the complexity and cost of the processes.

SUMMARY

In one aspect, this disclosure relates to a three-wire flat cable high-voltage plug-in light string. In another aspect, the disclosure relates to a method of making such three-wire flat cable high-voltage plug-in light string.

DETAILED DESCRIPTION

Embodiments of the present disclosure will be described below in conjunction with the accompanying drawings, but it should be appreciated by those skilled in the art that the embodiments described below are exemplary, rather than exhaustive. They are only used to illustrate the present disclosure and should not be regarded as limiting the scope of the present disclosure. All other embodiments obtained by those of ordinary skill in the art without creative efforts based on the embodiments disclosed herein shall fall within the scope of the present disclosure.

This disclosure relates to three-wire flat cable high-voltage plug-in light strings and the processes of making thereof.

Figure 1:
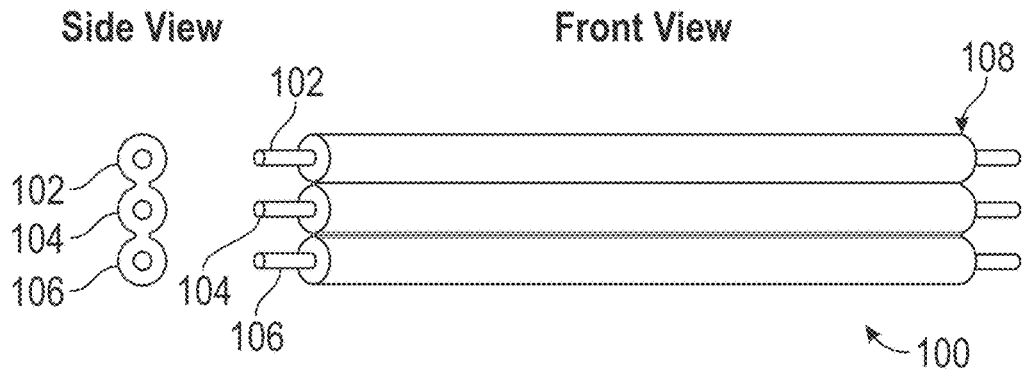
FIGS. 1, 2a, and 3-25 illustrate the exemplary steps in manufacturing three-wire flat cable high-voltage plug-in light strings, according to embodiments of the disclosure.

FIG. 1 illustrates an exemplary three-wire flat cable 100. The flat cable 100 includes 3 copper wires 102, 104, 106. The copper wires can be covered by and insulated from each other by an insulation layer 108. The insulation layer can be made or Polyvinyl Chloride (PVC) or any other suitable material.

Figure 2A:
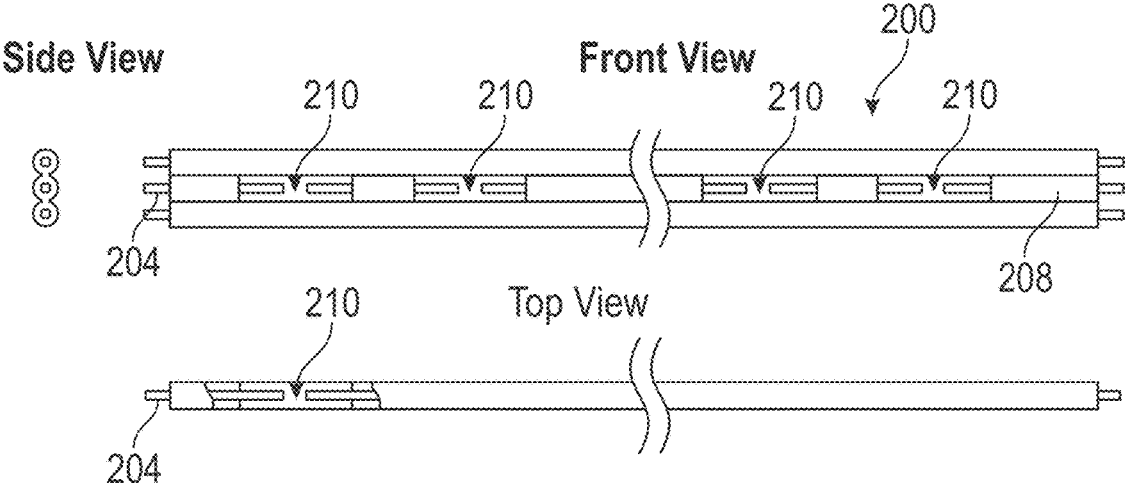

First, as illustrated in the various views of FIG. 2A, part of the insulation (e.g., PVC) layer 208 is removed from the middle wire 204 of the three-wire cable 200. The middle wire 204 is also cut in one or more places 210.

Figure 3:
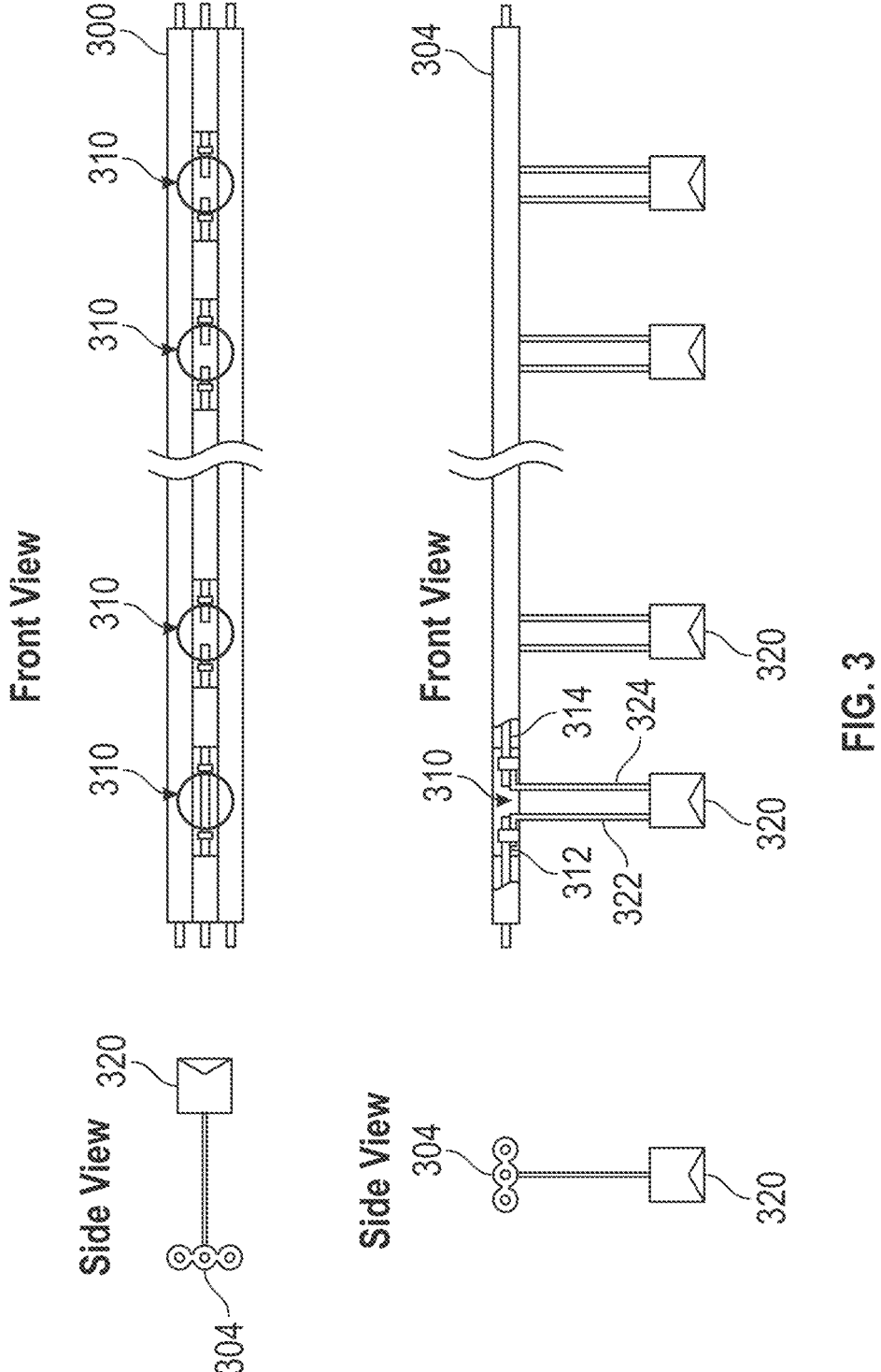

Next, as shown in FIG. 3, the two legs 322, 324 of a light emitting diode (LED) 320 can be connected to the two exposed ends 312, 314 of the middle wire 304 at a place where the middle wire 304 is cut in the previous step. The two legs 322, 324 of the LED 320 can be bent so that they can be welded or riveted to the exposed ends 312, 314 of the middle wire 304. As shown in the figure, multiple LEDs 320 can be connected to the middle wire 304 at the various places 310 where the middle wire 304 is cut.

Figure 4:
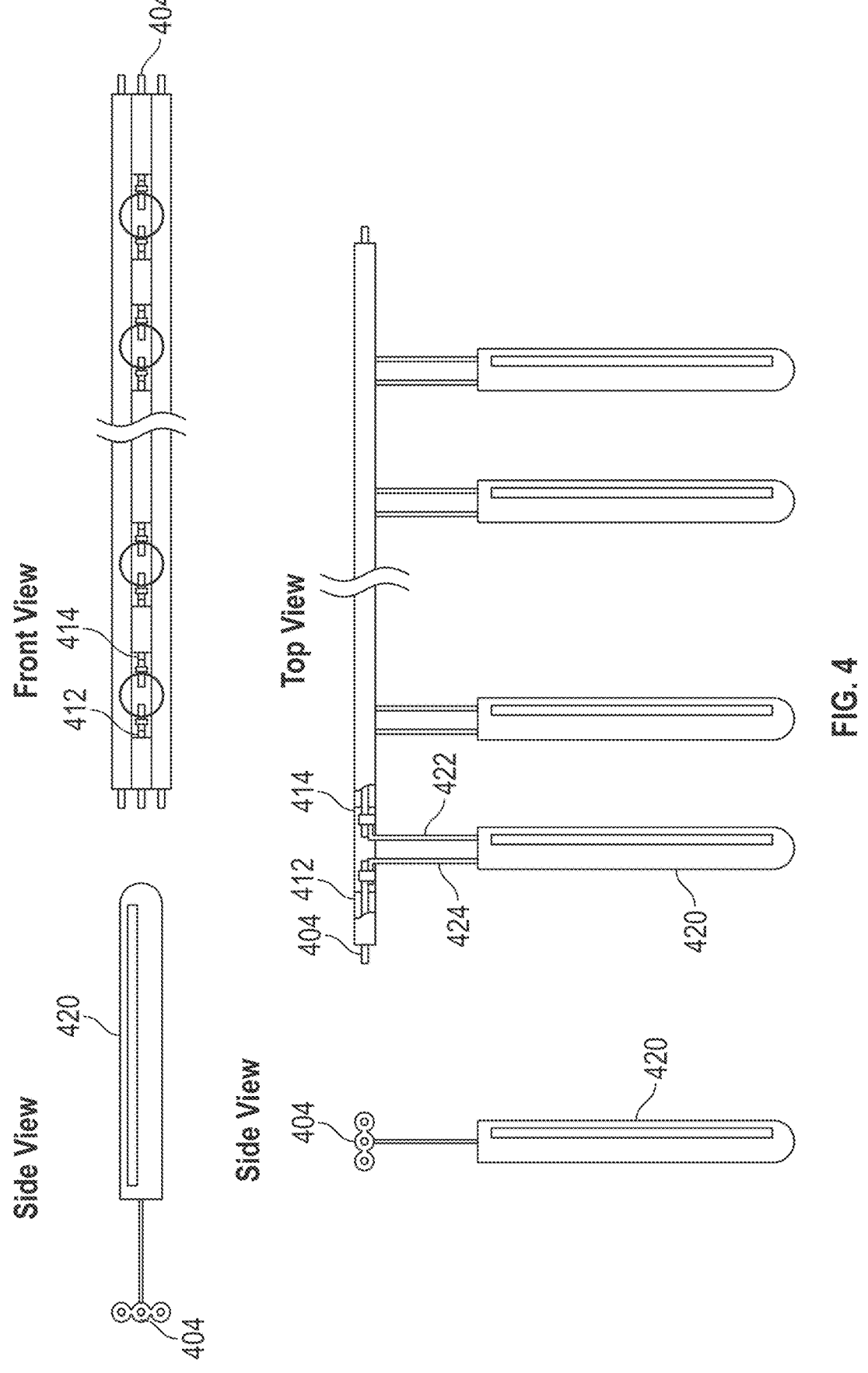

The same step illustrated in FIG. 3 can be used for connecting one or more filament strip LEDs to the middle wire of the three-wire flat cable, as illustrated in FIG. 4. In the illustrated example, the two legs 422, 424 of each filament strip LED 420 can be bent so that they can be welded or riveted (or connected by other suitable means) to the two exposed ends 412, 414 of the middle wire 404 at a place where the middle wire 404 is exposed and cut.

Figure 5:
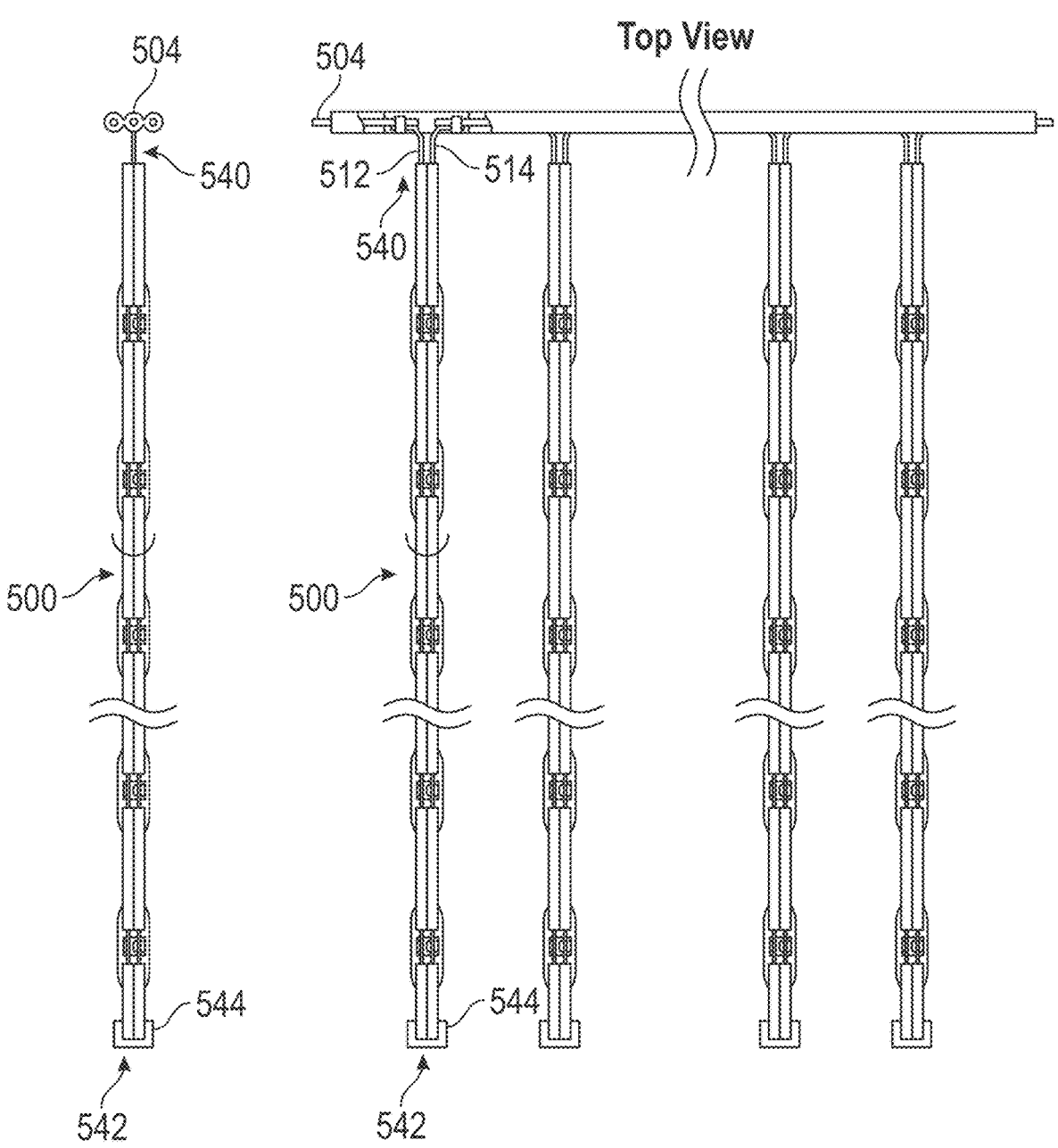

FIG. 5 illustrates another embodiment, in which a two-wire Surface Mount Device (SMD) light string with multiple SMD LEDs connected in parallel is connected to the middle wire of a three-wire flat cable in a similar fashion as discussed above with reference to FIGS. 3 and 4. As shown in FIG. 5, one end 540 of the two-wire SMD LED slight string 500 can be striped of the insulation wrap to expose 2 copper wires 512, 514. The exposed copper wires 512, 514 can be connected, respectively, by welding or riveting or any other suitable means to the two exposed ends of the middle wire 504 of the three-wire flat cable at a place where the middle wire 504 is cut. The other end 542 of the two-wire SMD LED light string 500 can be sealed by overholding 544 to protect the copper wires from being exposed. As shown in FIG. 5, multiple two-wired SMD LED light strings can be connected to the same three-wire flat cable at places where the three-wire flat cable is cut to expose the middle copper wire 504.

FIGS. 3-5 illustrate various embodiments of the disclosure, in which different types of lights or light strings can be connected to a three-wire flat cable in the same way discussed above.

Figures 6, 7:
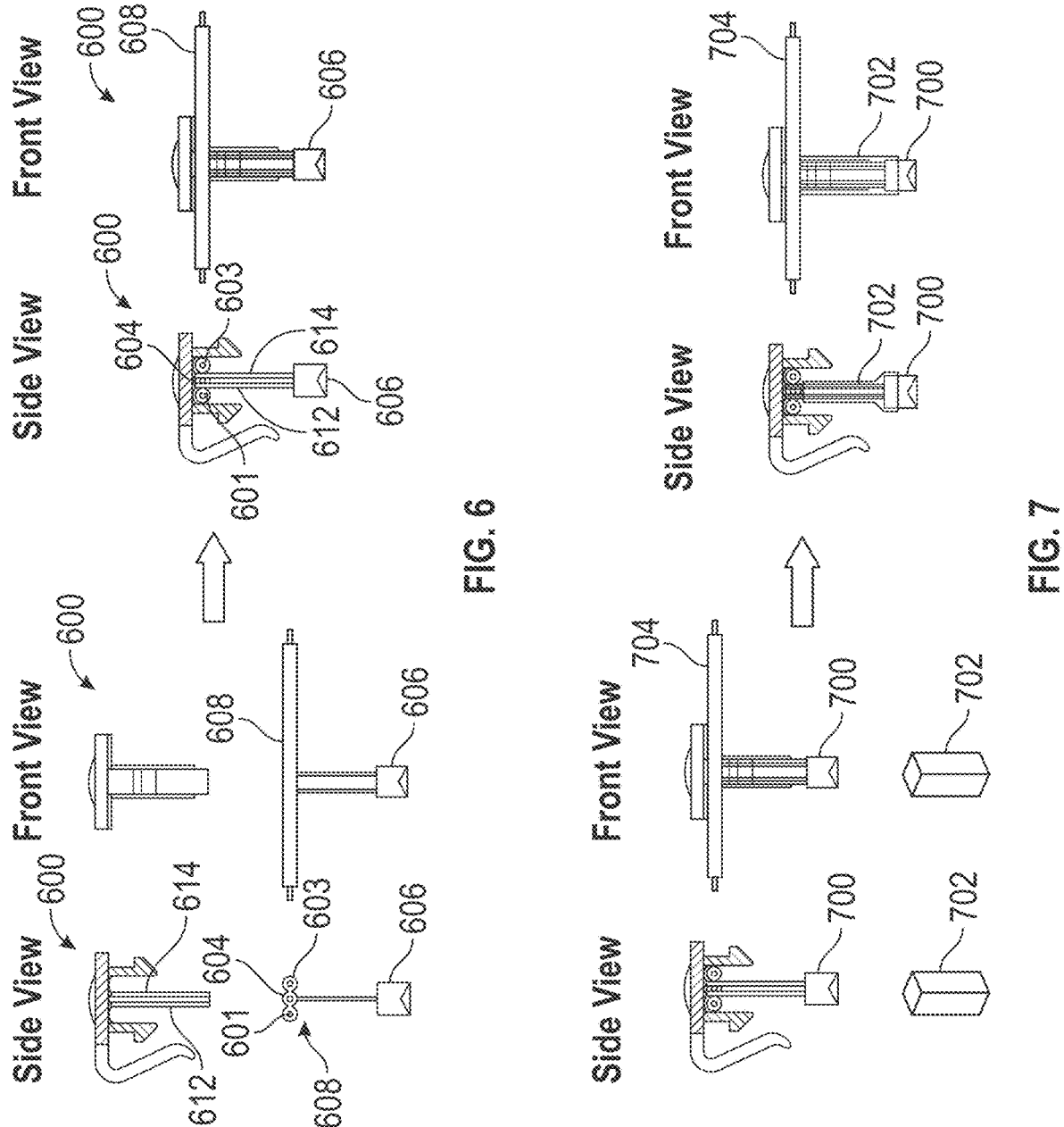

The steps illustrated in FIGS. 6-9 and discussed in the following paragraphs follow the step shown in FIG. 3. FIG. 6 illustrates the step following the step illustrated in FIG. 3. In this step, the tail cover 600 of a lamp holder is placed over the flat surface of the three-wire flat cable 608 over the space where the middle wire 604 of the three-wire flat cable 608 is exposed and cut. The tail cover 600 includes two parallel pieces 612, 614 that can be inserted through the exposed section of the three-wire flat cable with each of the parallel pieces 612, 614 inserted between the exposed middle wire 604 and one of the outside wires 601, 603. In this example, the parallel pieces 612, 614 can extend to LED 606 that is connected to the three-wire flat cable 608. The step illustrated in FIG. 6 can be done with multiple tail covers over multiple exposed sections of the three-wire flat cable 608.

After the tail cover is inserted over the three-wire flat cable, a heat shrink tube 702 can cover each LED 700 connected to the three-wire cable 704, as illustrated in FIG. 7. The heat shrink tube can protect and waterproof the LED 700.

Figures 8, 9:
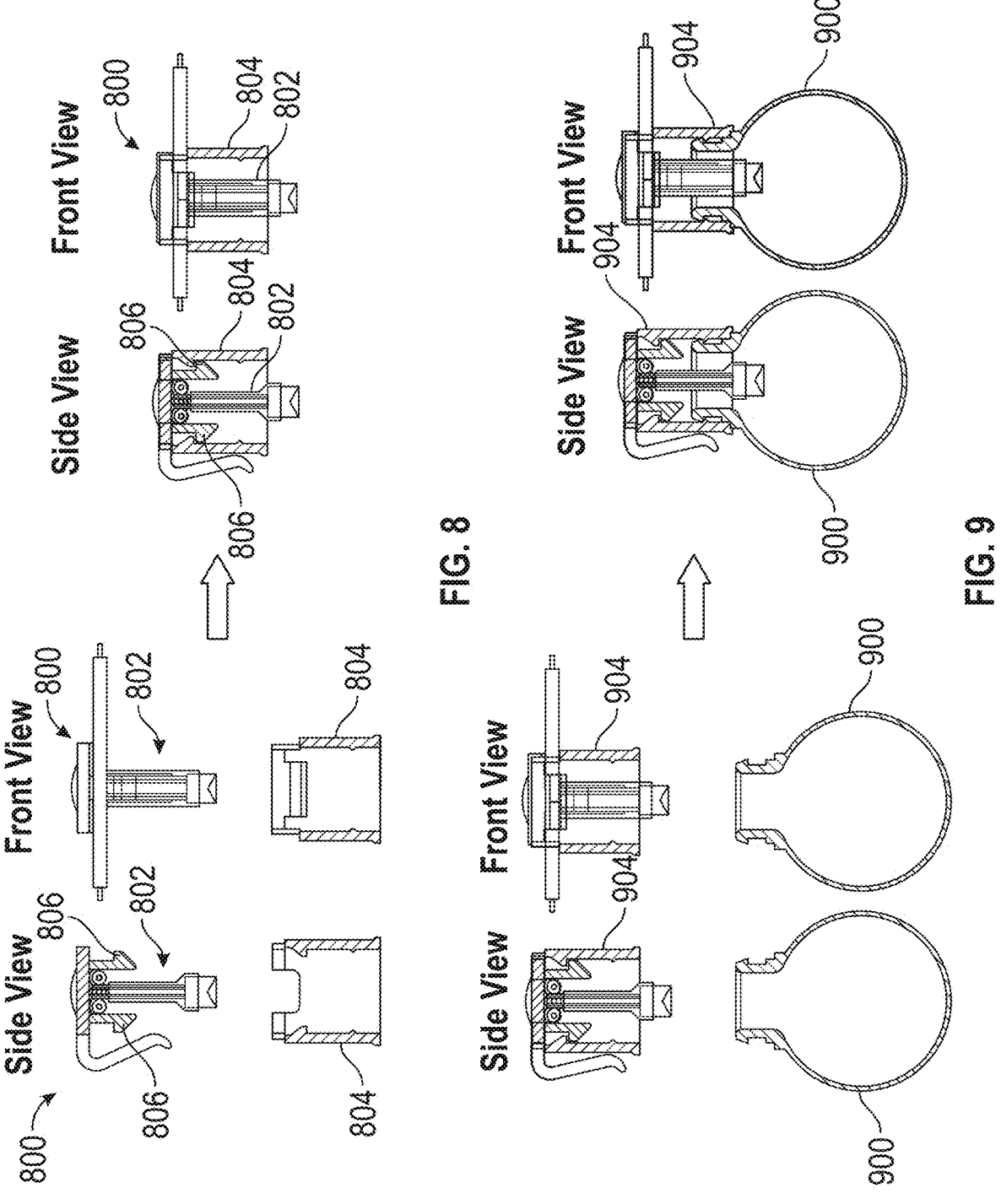

Next, as illustrated in FIG. 8, a lamp head 804 can be placed over the LED assembly 802 from the previous step. The tail cover 800 can include a hook-shaped part 806 than can hold the lamp head 804 to secure the position of the LED assembly 802.

A decorative shell 900 can be assembled onto the lamp head 904, as illustrated in FIG. 9.

Figures 10, 11:
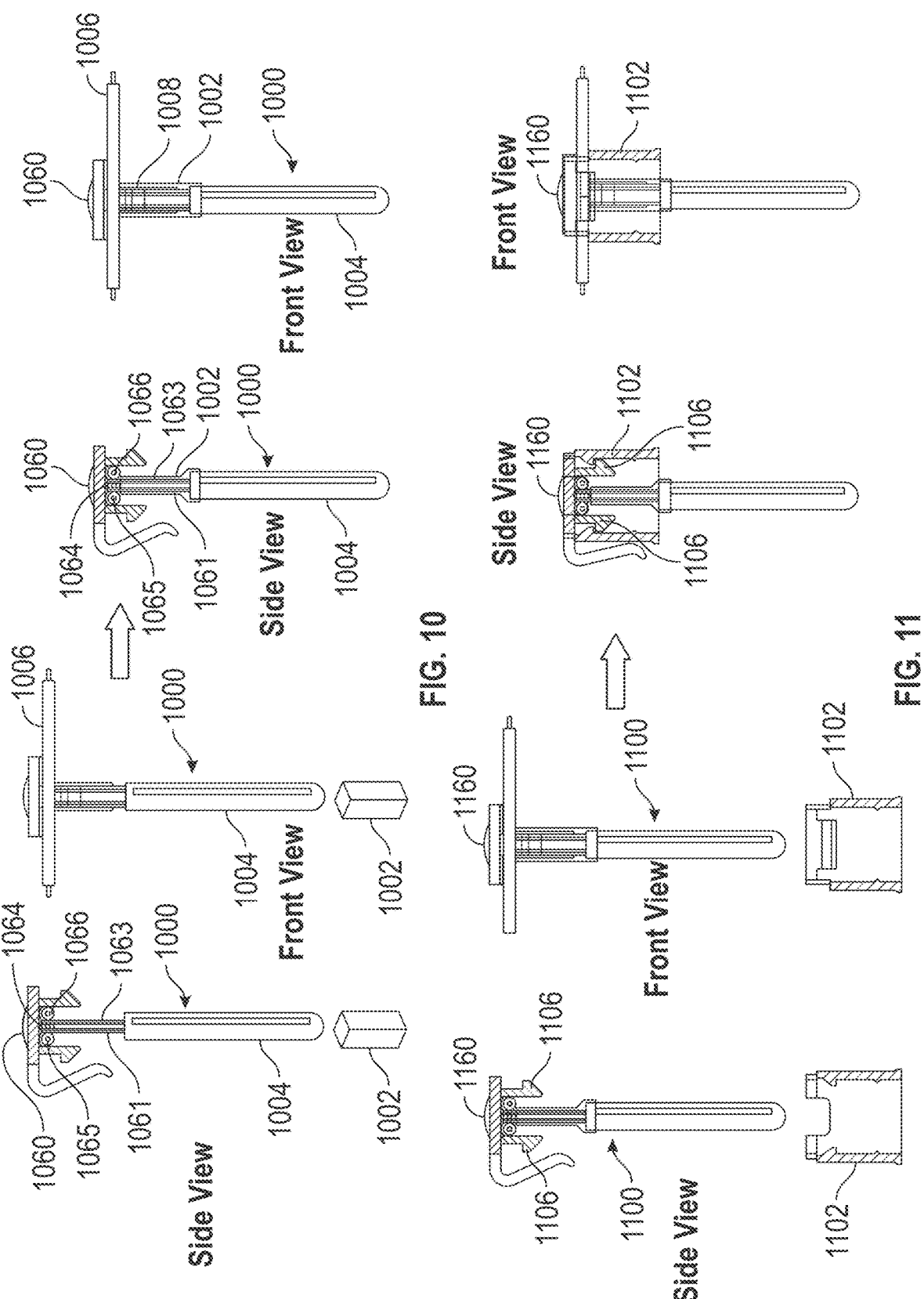

The steps illustrated in FIGS. 10-13 follow the step shown in FIG. 4. FIG. 10 illustrates the assembly 1000 of FIG. 4. The assembly 1000 includes a filament LED 1004 connected to a three-wire flat cable 1006. In this step, the tail cover 1060 of a lamp holder is placed over the flat surface of the three-wire flat cable 1006 over the space where the middle wire 1064 of the three-wire flat cable 1006 is exposed and cut. The tail cover 1060 includes two parallel pieces 1061, 1063 that can be inserted through the exposed section of the three-wire flat cable with each of the parallel pieces 1061, 1063 inserted between the exposed middle wire 1064 and one of the outside wires 1065, 1066. In this example, the parallel pieces 1061, 1063 can extend to the filament LED 1004 that is connected to the three-wire flat cable 1006.

In addition, a heat shrink tube 1002 can wrap part of the assembly 1000. Specifically, as shown in FIG. 10, the heat shrink tube 1002 can wrap around the leg portion 1008 of the filament LED 1004 to protect it and waterproof part or the whole assembly 1000. The step illustrated in FIG. 10 can be carried out on multiple filament LEDs connected to a three-wire flat cable.

Next, as illustrated in FIG. 11, a lamp head 1102 can be fitted onto the assembly 1100 of FIG. 10. The tail cover 1160 can include a hook-shaped part 1106 than can hold the lamp head 1102 to secure the position of the filament LED assembly 1100.

Figure 12:
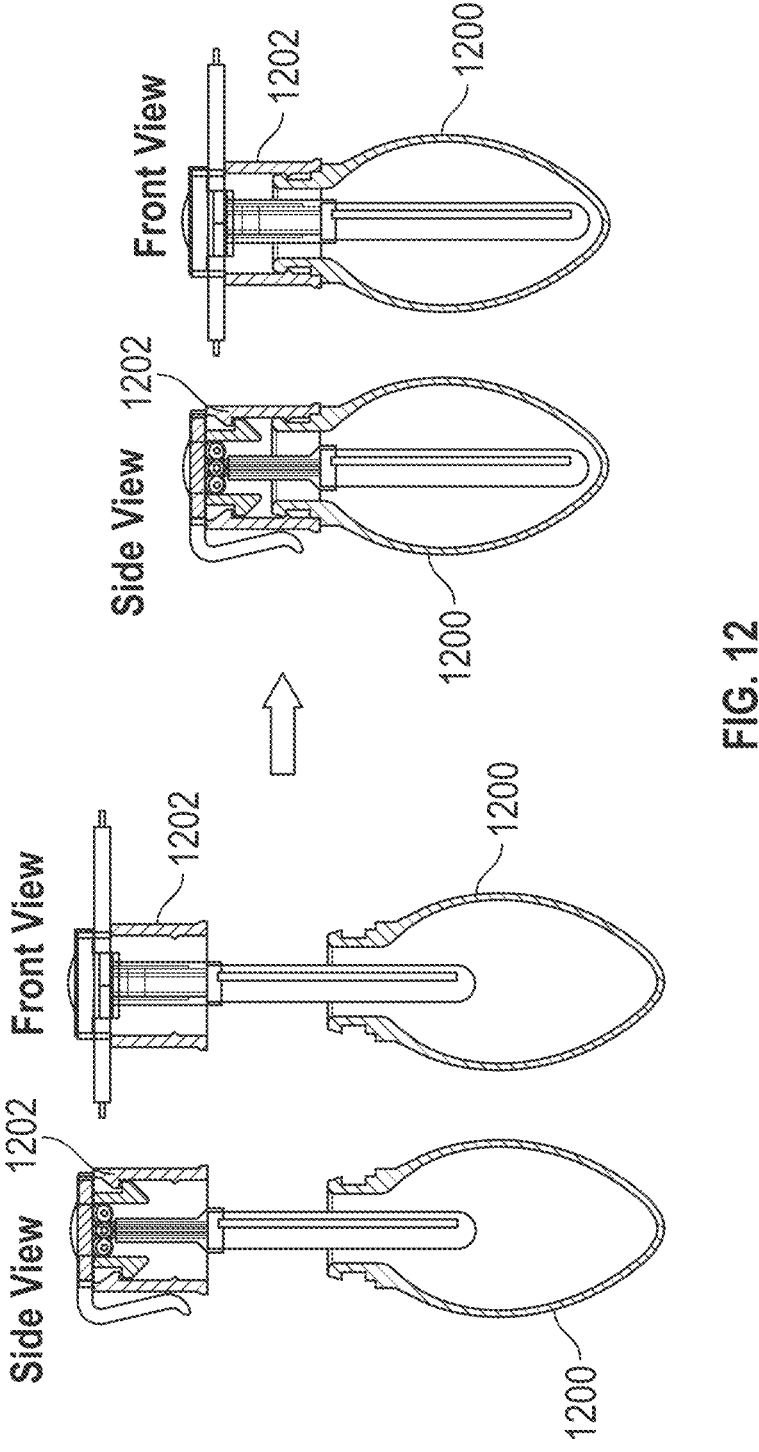

As shown in FIG. 12, a decorative shell 1200 can be assembled onto the lamp head 1202, as illustrated in FIG. 12. The decorative shell 1200 can be of any shape or color.

Figures 13, 14:
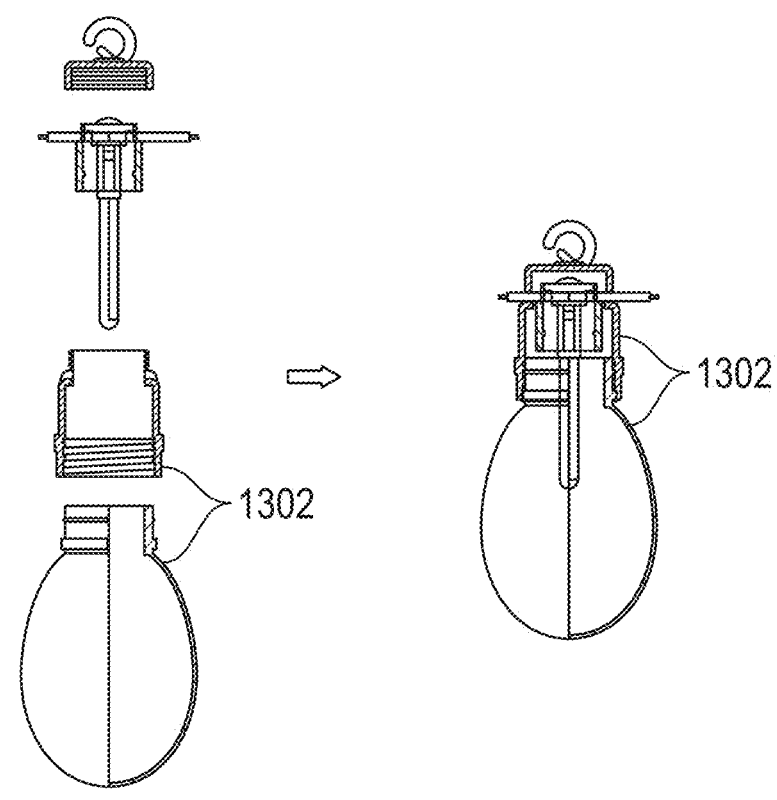

Alternatively and additionally, as shown in FIG. 13, a fake lamp head decorative shell 1302 can be added to create additional effects.

FIGS. 14-18 illustrate alternative embodiments. The embodiment of FIG. 14 also has an LED 1401 connected to a three-wire flat cable 1403. In this embodiment, an inner plug 1400 is inserted into the spaces between the exposed cut middle wire 1404 and the outer wires 1402, 1406 of the three-wire flat cable 1403. The inner plug 1400 serves the same purpose (e.g., supporting and isolating the two legs of the LED) as the tail cover of the lamp holder in the previous embodiments (e.g., FIG. 6).

Figure 15:
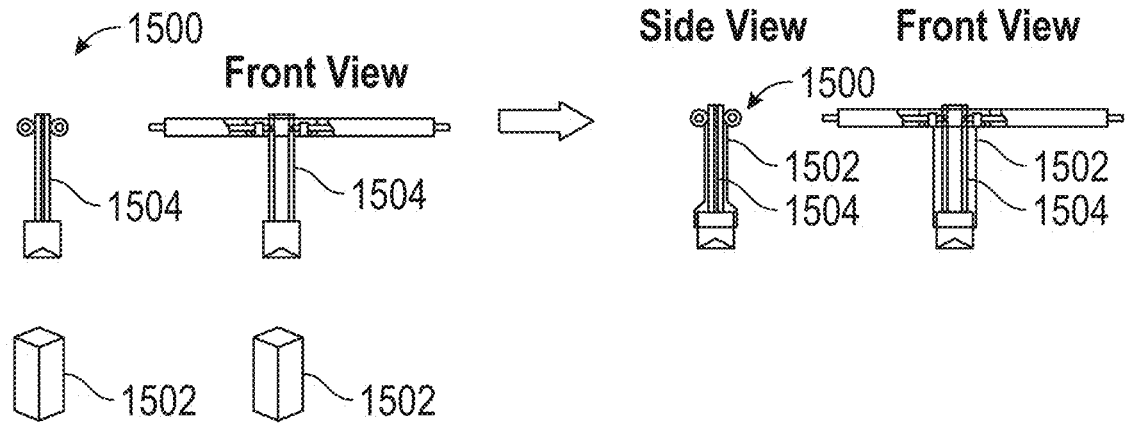

As shown in FIG. 15, a heat shrink tube 1502 can be added to the assembly 1500 of FIG. 14. The heat shrink tube 1502 can wrap around the inner plug 1504 to protect and waterproof the assembly 1500.

Figure 16:
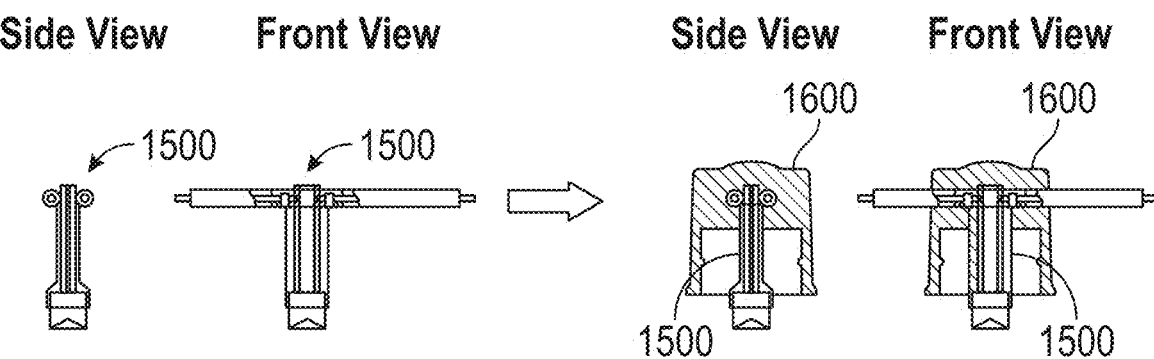
Figure 17:
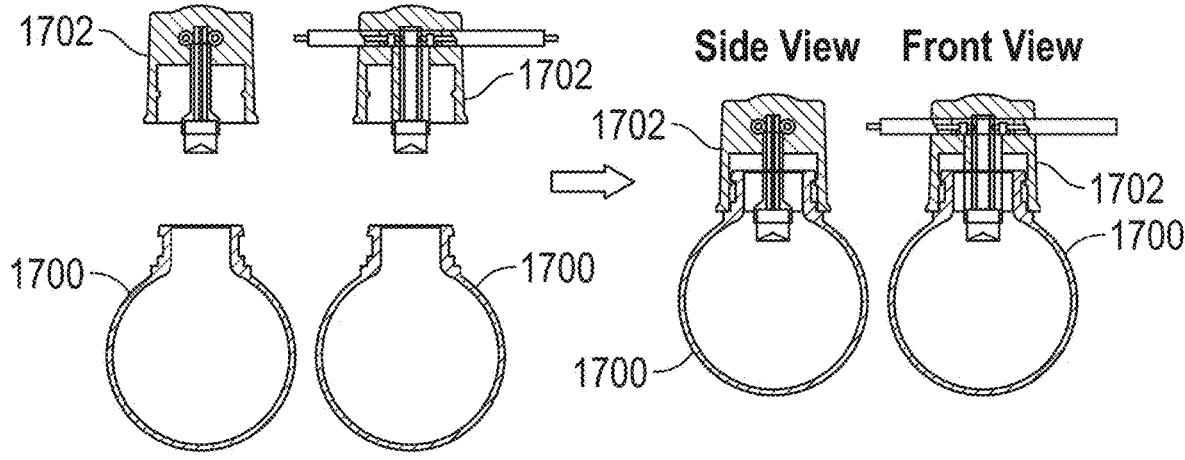

Next, as shown in FIG. 16, a lamp holder 1600 can be overmolded directly on the assembly 1500 of FIG. 15. As illustrated in FIG. 17, a decorative shell 1700 can be added to create certain effects. The decorative shell 1700 can be of any shape and color, and can be locked into the lamp holder 1702 of the assembly. The lamp holder 1702 can be made of plastic or other suitable material.

Figure 18:
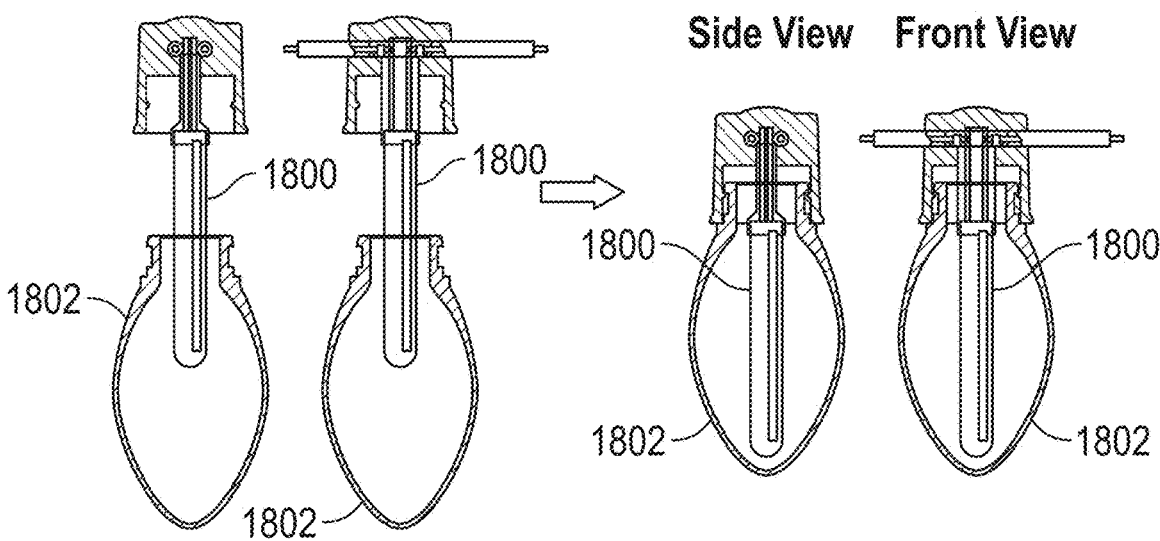

The embodiment illustrated in FIG. 18 replaces the LED of FIGS. 14-17 with a long filament LED 1800 and have a different decorative shell 1802 than the one shown in FIG. 17.

Figure 19:
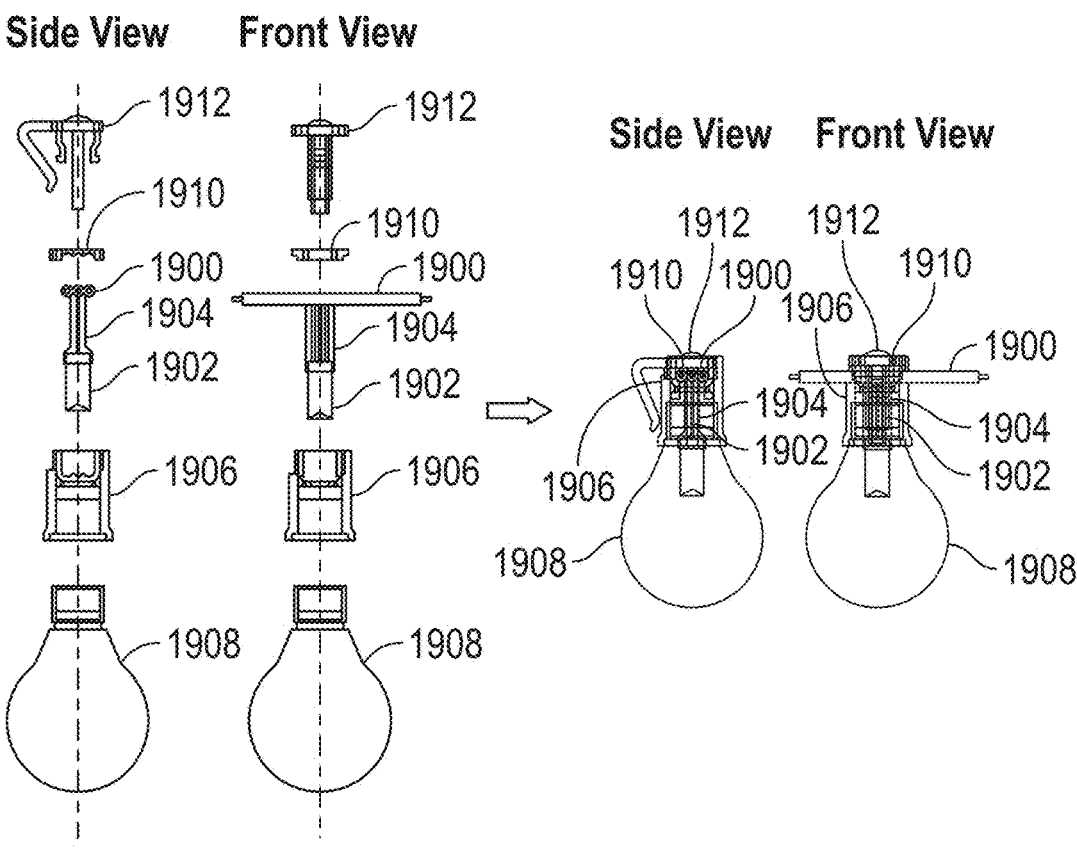

FIG. 19 illustrates a different embodiment of the disclosure. As shown in the figure, an LED 1902 can be connected to a three-wire flat cable 1900, and a heat shrink tube 1904, a lamp head 1906, and a decorative shell 1908 can be added to the assembly in the same fashion as discussed in the previous embodiments. In this embodiment, a waterproof accessory 1910 can be added inside the lamp head 1906 between a flat surface of the three-wire flat cable 1900 and the tail piece 1912 of the lamp head 1906 to achieve waterproof effect. The waterproof accessory 1910 can be made of silicon or any other suitable material.

Figure 20:
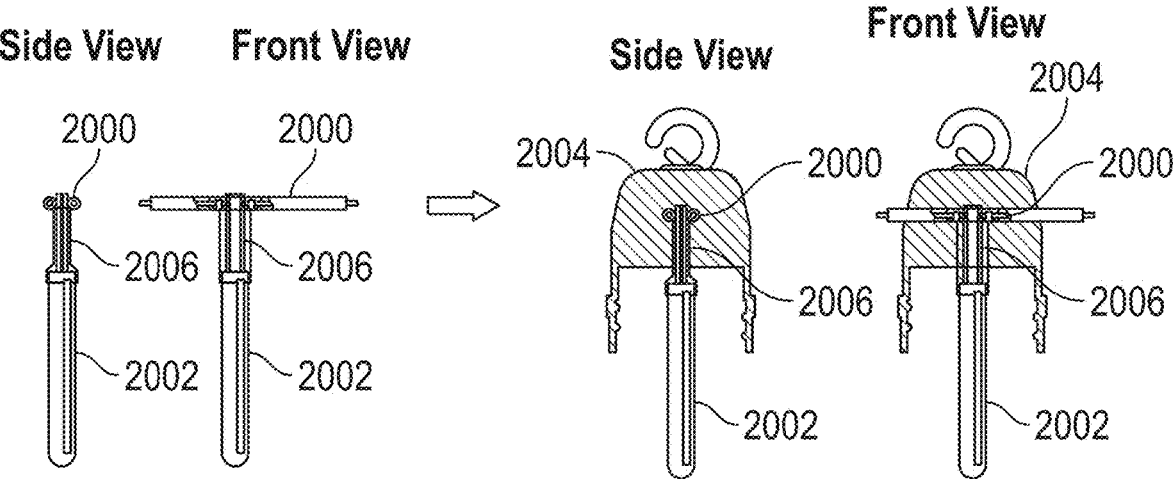
Figure 21:
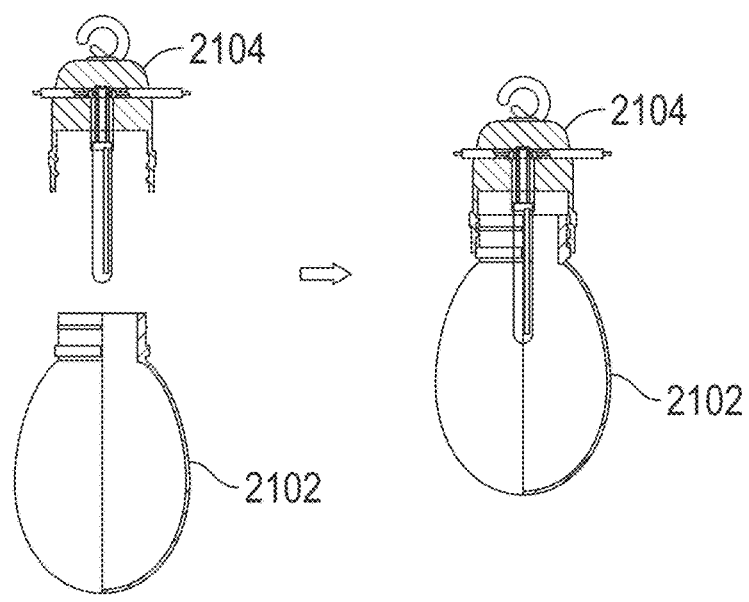

FIGS. 20 and 21 illustrates another embodiment of the disclosure. In this embodiment, as shown in FIG. 20. A filament LED 2002 is attached to a three-wired flat cable 2000 in the same fashion as discussed in the previous embodiments. A lamp holder 2004 can be overmolded directly over the three-wired flat cable 2000 and at least a portion 2006 of the filament LED 2002. The lamp holder 2024 can be made of plastic or any other suitable material.

A decorative shell 2102 can then be assembled onto the lamp holder 2104, as illustrated in FIG. 21. The decorative shell 2102 can be of any shape or color.

Figure 22:
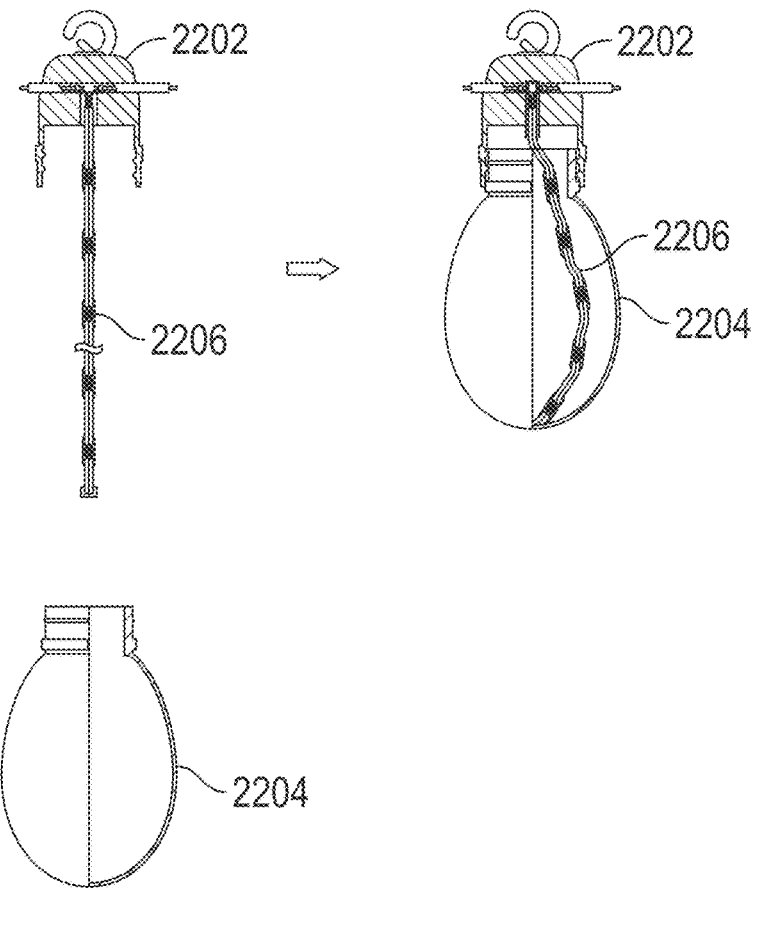

FIG. 22 illustrates another embodiment similar to embodiment illustrated in FIGS. 20 and 21. This embodiment also includes a lamp holder 2202 overmolded directly onto a light source and a decorative shell 2204 assembled onto the lamp holder 2202, enclosing the light source. The difference is that, in this embodiment, the light source is an SMD electric cord light string 2206 instead of the filament LED of the previous embodiment.

Figure 23:
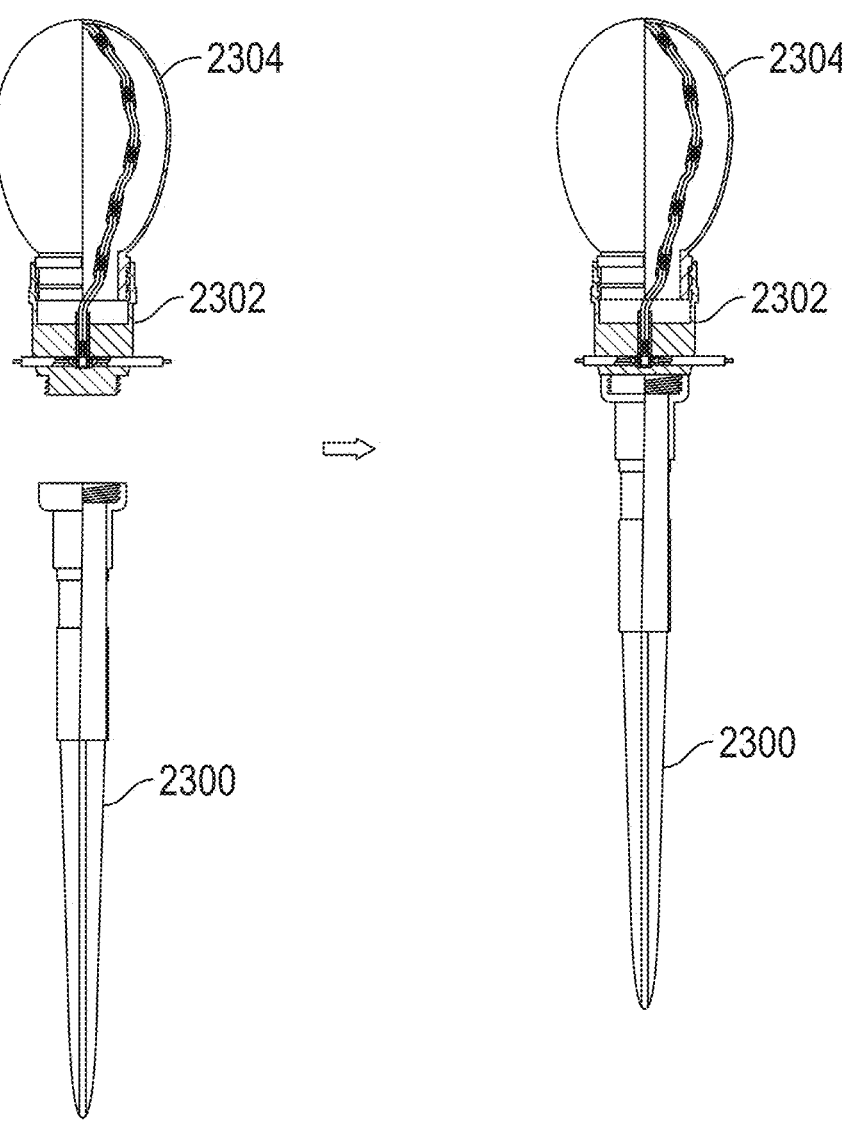

As shown in FIG. 23, a ground stake 2300 can be attached to the end of the lamp holder 2302 that is not attached to a decorative shell 2304 in any of the light assembly discussed in the embodiments above. The ground stake 2300 is for securing the light assembly in the ground.

Figure 24:
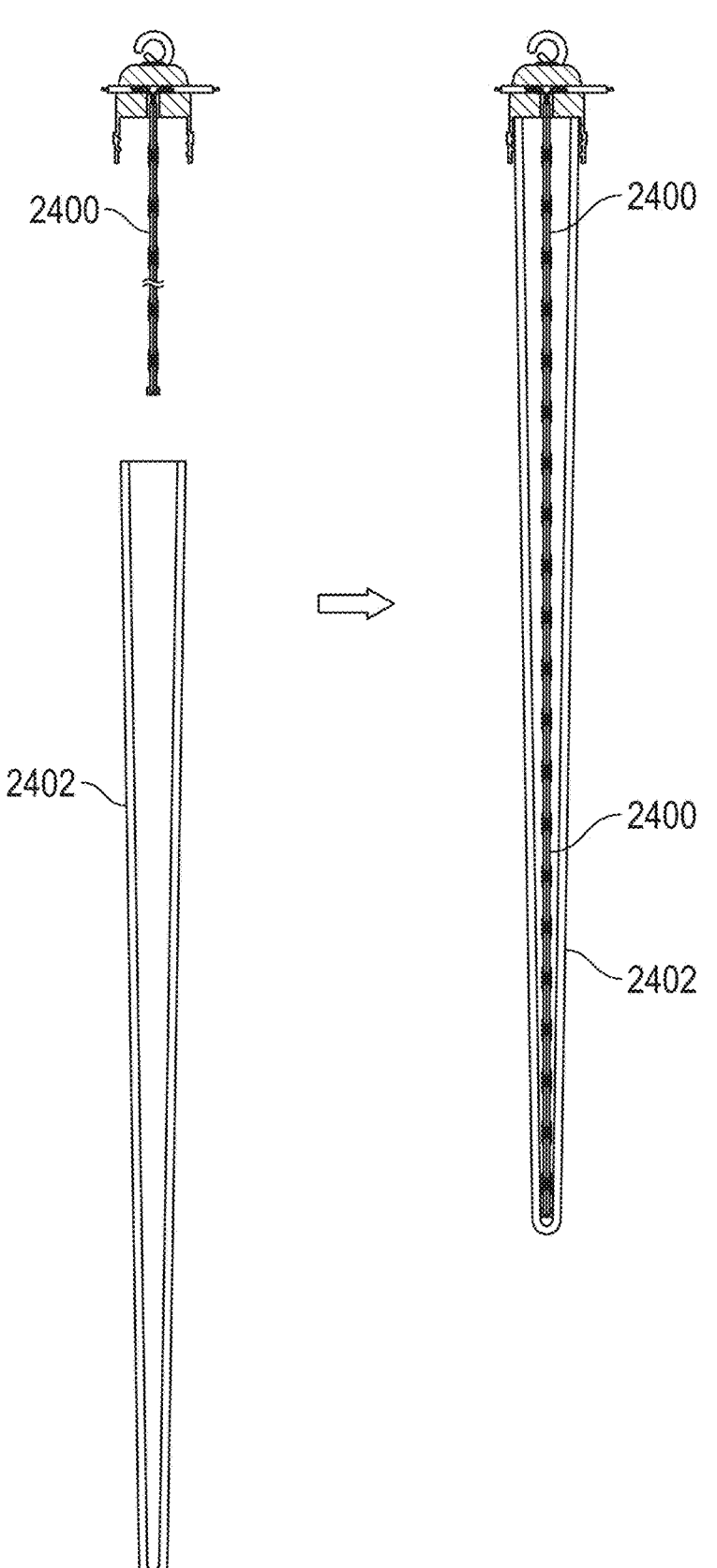

FIG. 24 shows an alternative embodiment to the one shown in FIG. 22. This alternative embodiment can include multiple SMD LED strings 2400 connected in series combined with icicle (or other) shaped decorative shell 2402 to achieve a wide range of applications.

Figure 25:
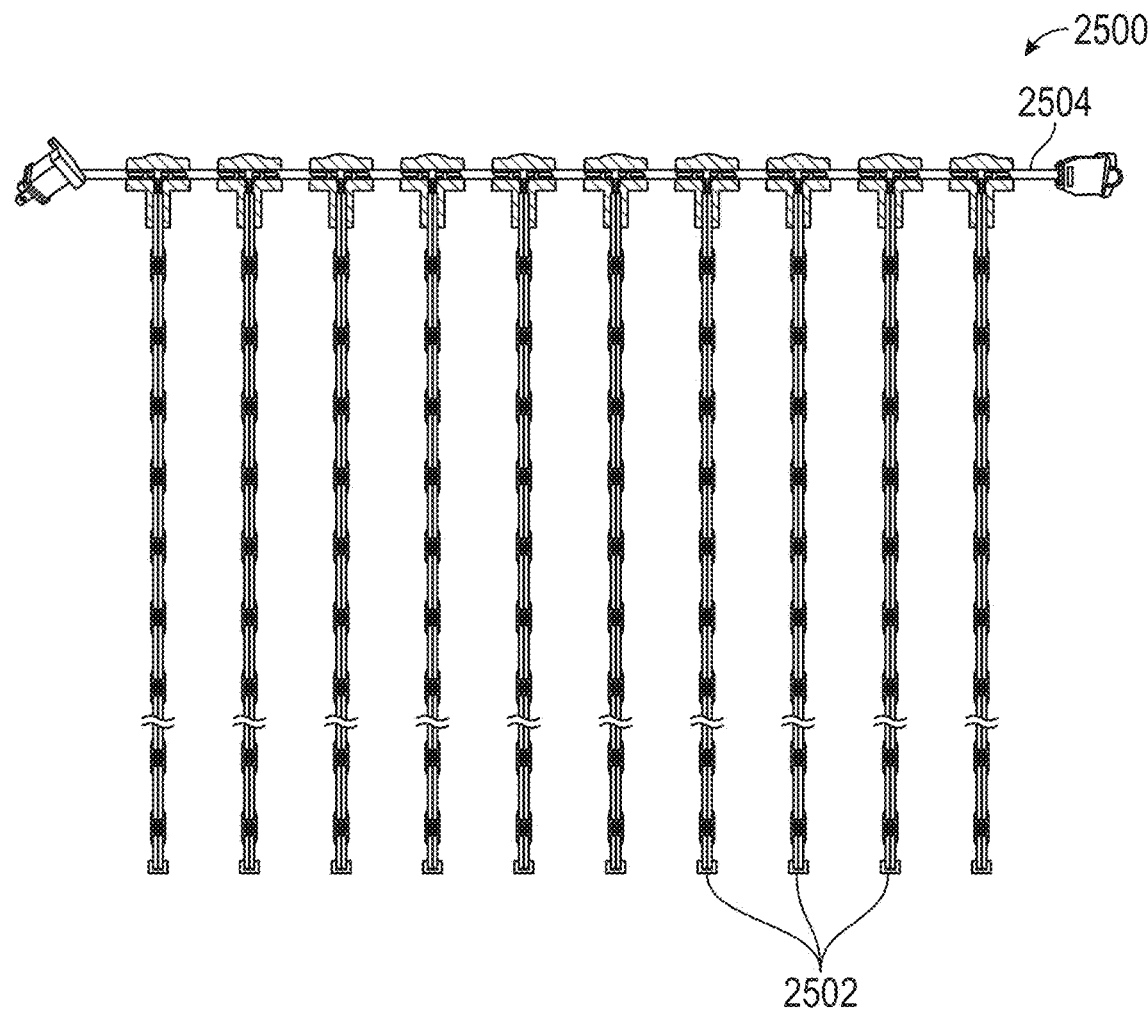

FIG. 25 illustrates an exemplary flexible insulated electric cord light string 2500 with multiple SMD LED strings 2502 all connected to a three-wire flat cable 2504 using the mechanisms disclosed in the embodiments above to create a curtain light effect.

Figure 26:
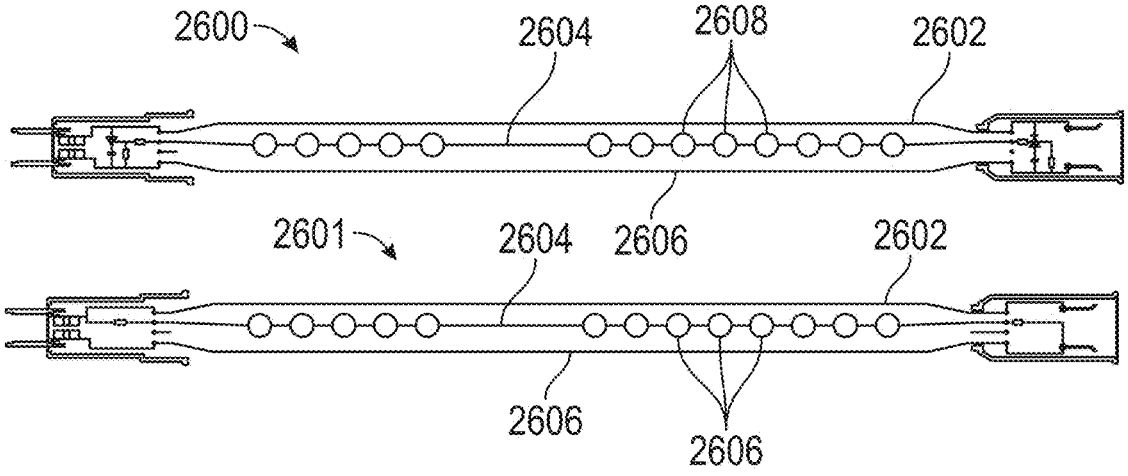
FIG. 26 is a schematic diagram of an exemplary circuit of a light string, according to an embodiment of the disclosure.

FIG. 26 is schematic circuit diagrams illustrating exemplary circuits of the three-wire flat cable light strings of the various embodiments of the disclosure. Each circuit 2600, 2601 shows 3 wires 2602, 2604, 2606 with the middle wire 2604 cut at one or more locations 2608 for connecting to one or more light sources (not shown in FIG. 26).

With reference to FIGS. 27-34, another embodiment is provided relating to methods for manufacturing high-voltage light strings utilizing a three-wire flat cable, distinct from those described in prior embodiments. In this embodiment, the manufacturing process commences in accordance with the steps illustrated in FIGS. 1 and 2*a*. Following completion of the steps in FIG. 2*a*, a portion of the insulation layer (e.g., polyvinyl chloride (PVC)) 208 is removed from the middle wire 204 of the three-wire flat cable 200. Subsequently, the exposed middle wire 204 is severed at one or more designated locations 210.

Figure 27:
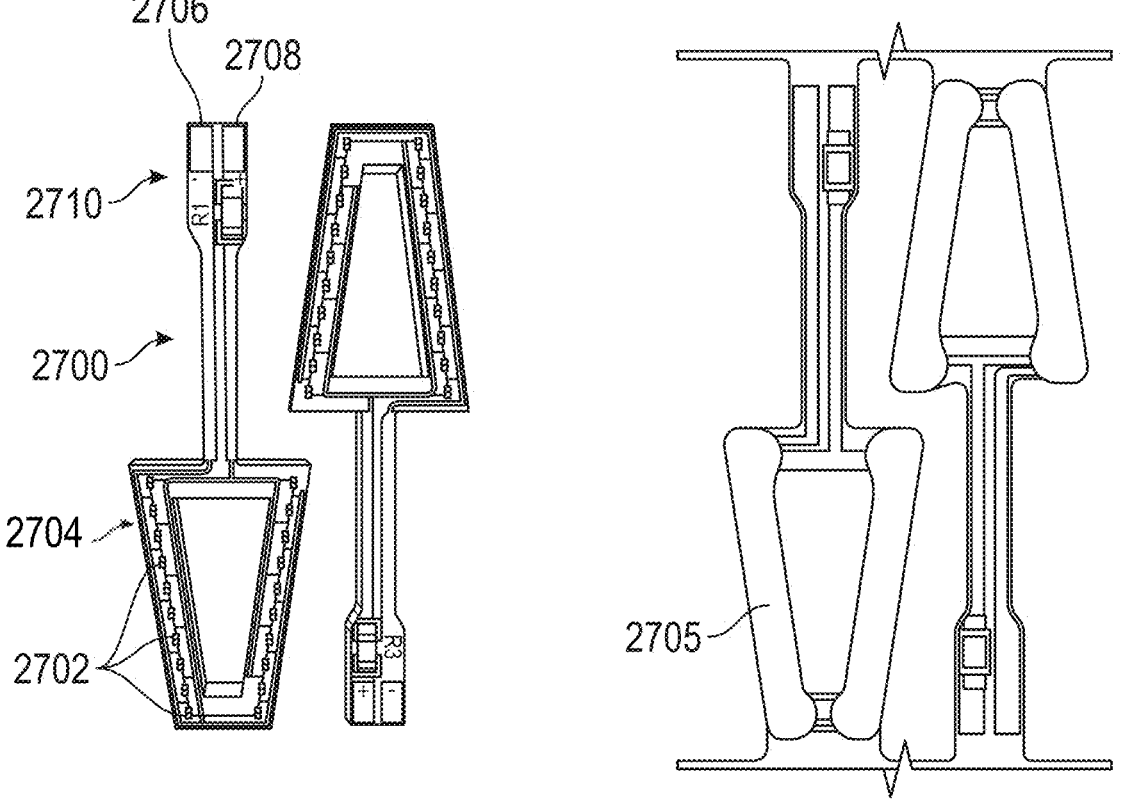

As shown in FIG. 27, a circuit board 2700 is provided. A plurality of SMDs (collectively 2702) are mounted onto a predetermined region 2704 of the circuit board 2700. In certain embodiments, phosphor materials 2705 can be applied over the mounted SMDs 2702 to create distinct luminous patterns. The circuit board 2700 can also include a pair of exposed conductor contact patches 2706, 2708 positioned at a terminal end 2710 of the board 2700 for electrical connection.

Figure 28:
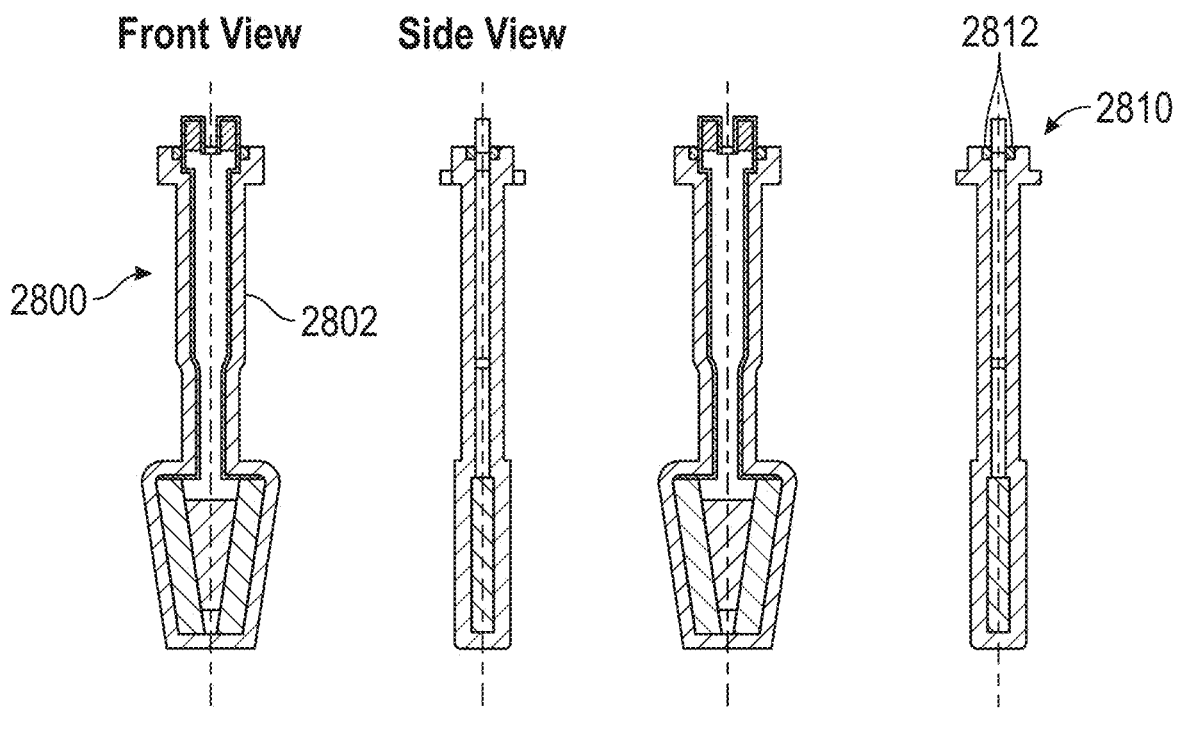

Referring now to FIG. 28, the SMD circuit board 2800 is enclosed within a transparent encapsulation shell 2802. The encapsulation shell 2802 can protect the SMD circuit board 2800. As further shown in FIG. 28, the encapsulation is completed by sealing the terminal end 2810 of the shell using a plug or an adhesive compound (e.g., glue) 2812 to make the enclosure waterproof.

Figure 29:
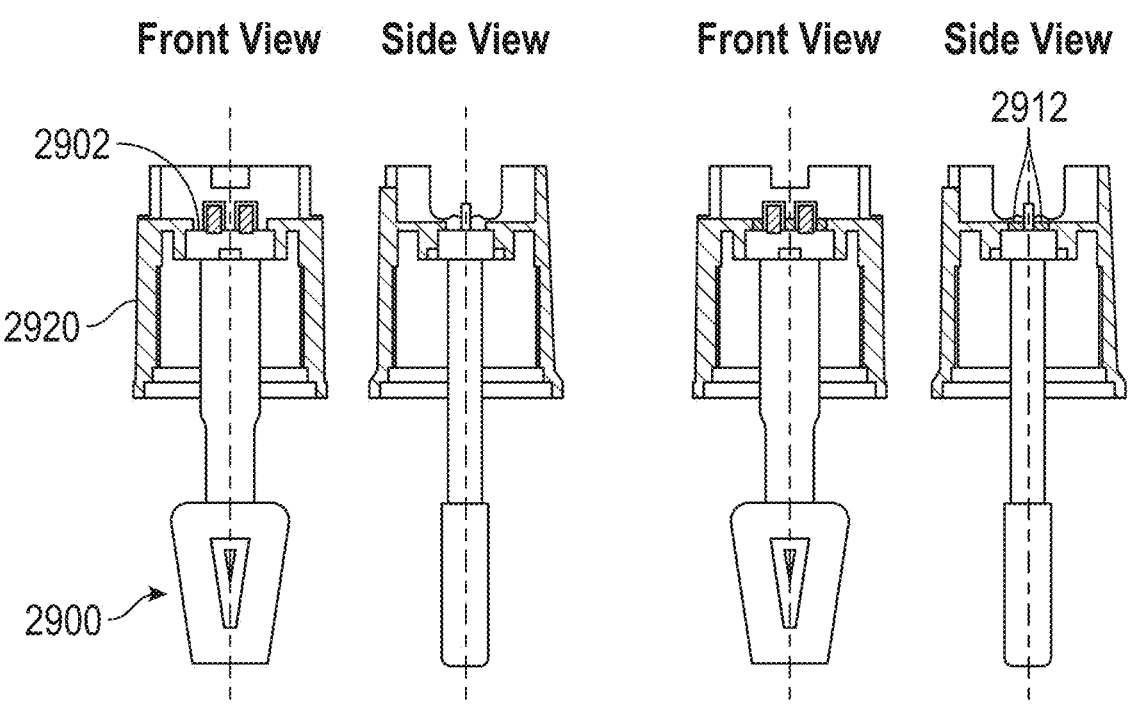

With reference to FIG. 29, a light base 2920 is fitted over a terminal portion 2902 of the light-emitting SMD circuit board 2900 protected by the transparent shell. As further illustrated in FIG. 29, the light base 2920 can be affixed to the terminal end 2910 of the encapsulated circuit board 2900 using an adhesive (e.g., glue) 2912 to maintain a secure, waterproof assembly.

Figure 30:
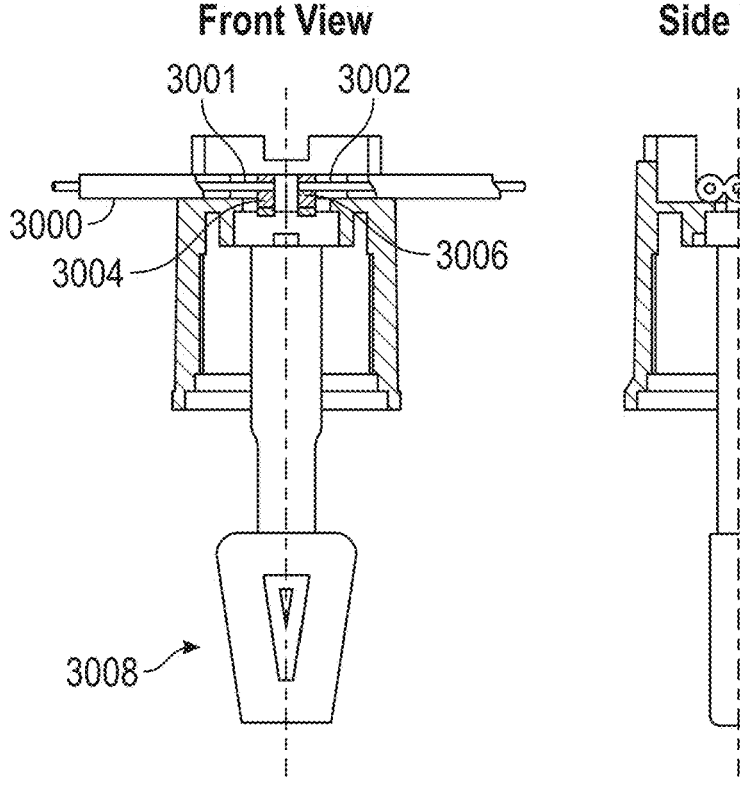

As shown in FIG. 30, exposed segments 3001, 3002 of the middle wire 3003 of the three-wire flat cable 3000 (prepared according to FIG. 2) are soldered (or welded) to the contact patches 3004 and 3006 of the SMD circuit board 3008, respectively. These connections electrically couple the two poles of the SMD circuit board 3008, thereby placing the SMDs (not illustrated in FIG. 30) in series with the middle wire 3003. This soldering and connection step may be repeated to form a continuous light string comprising multiple SMD circuit boards connected in series.

Figure 31:
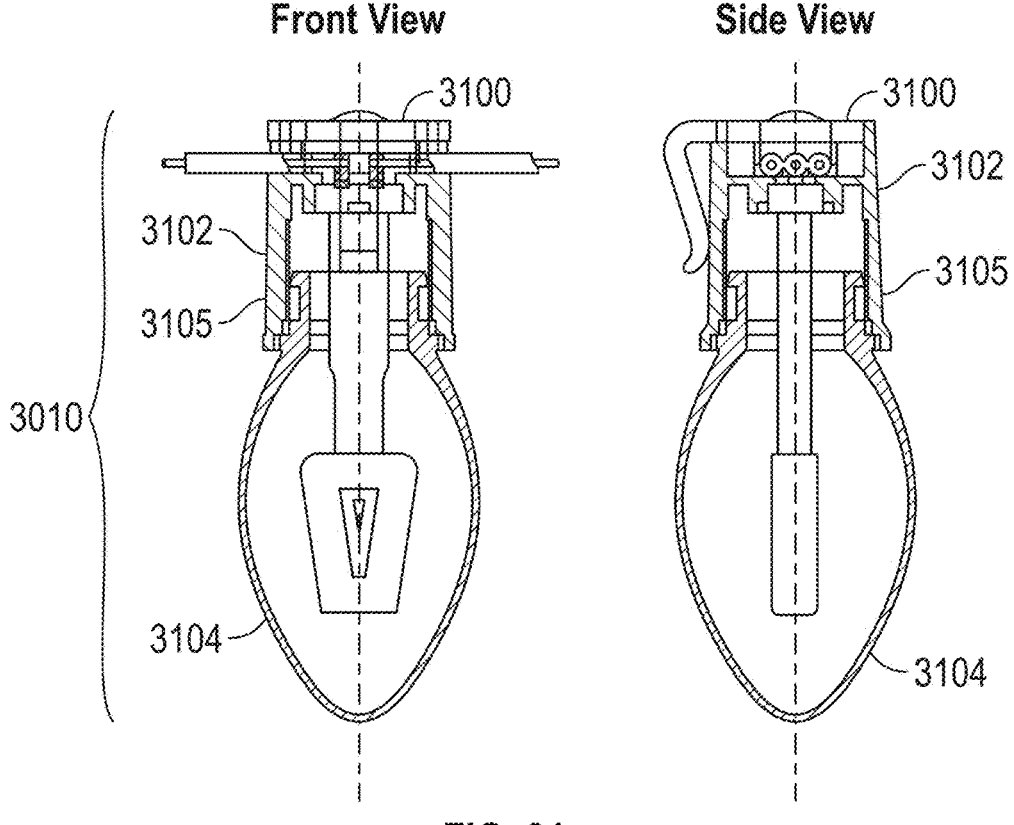
Figure 32:
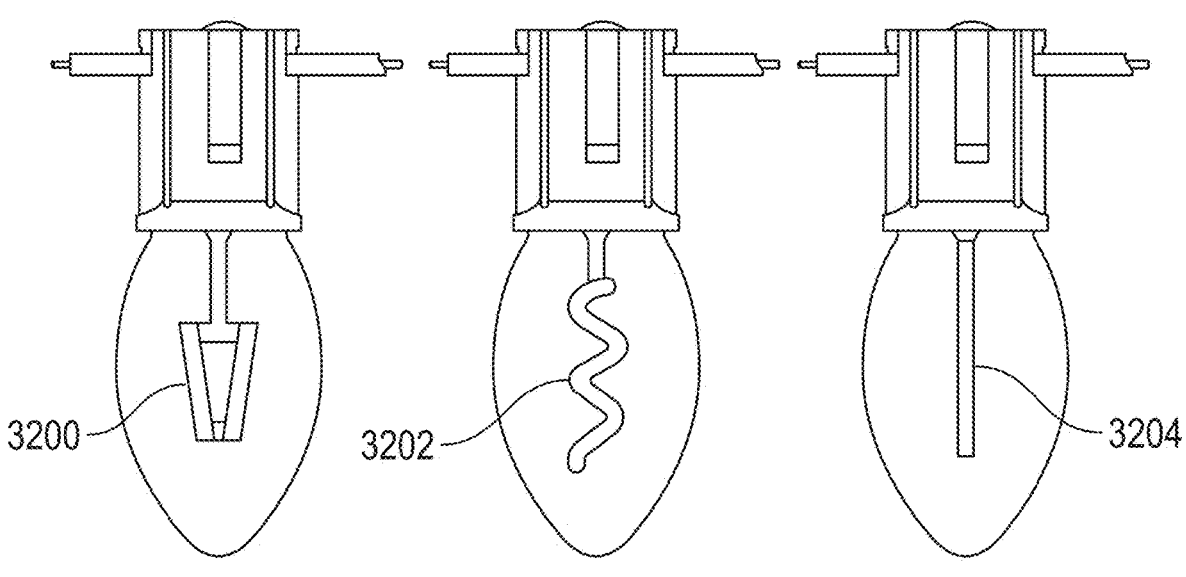

In a subsequent step, illustrated in FIG. 31, a light cover 3100 is placed over the top of the light base 3102 and a decorative shell 3104 is secured to the base portion 3105 of the light base 3102 to form a complete light assembly 3010.

In various embodiments, the circuit board may be fabricated in different geometric configurations 3200, 3202, 3204 (see FIG. 32) to simulate different filament effects within the light assembly.

Figure 33:
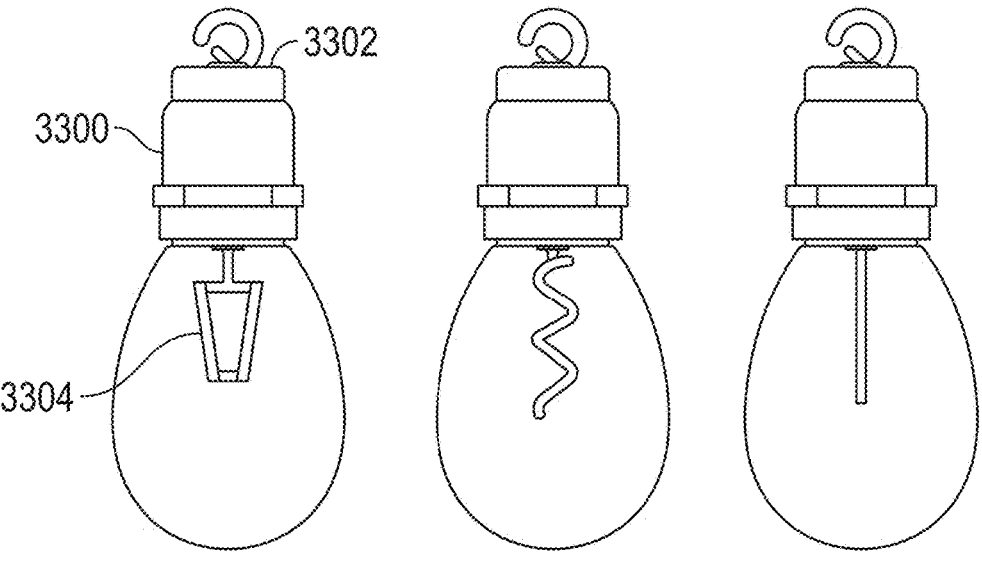

Furthermore, the visual and functional characteristics of the light string may be customized through the selection of light bases 3300, light covers 3302, and/or SMD circuit boards 3304 having various shapes, sizes, and configurations, as illustrated in FIG. 33.

Figure 34:
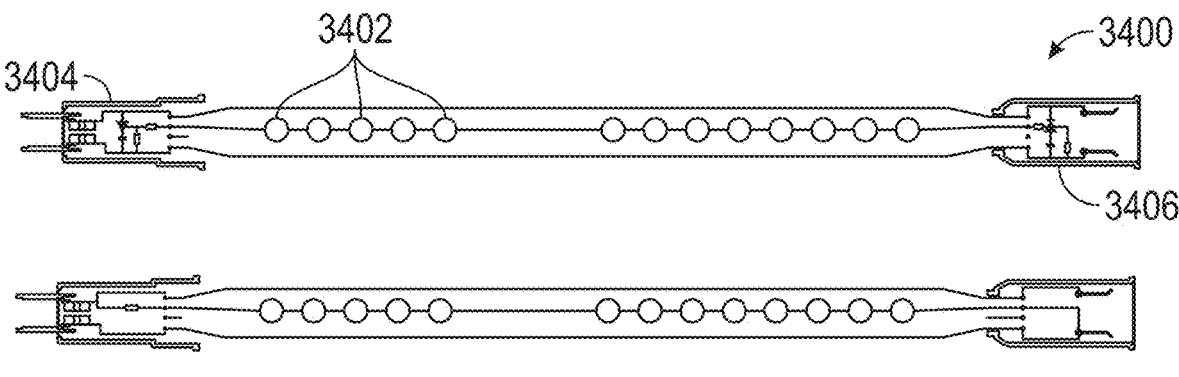
FIG. 34 is a schematic diagram of an exemplary circuit of a light string, according to an embodiment of the disclosure.

FIG. 34 illustrates a representative circuit diagram of a light string 3400 constructed in accordance with the disclosed embodiments. The light string 3400 includes multiple circuit boards (collectively 3402) connected in a series. A front plug 3404 and a rear plug 3406 are disposed at opposing ends of the light string 3400 to provide electrical interfacing with a power source.

Figure 2B:
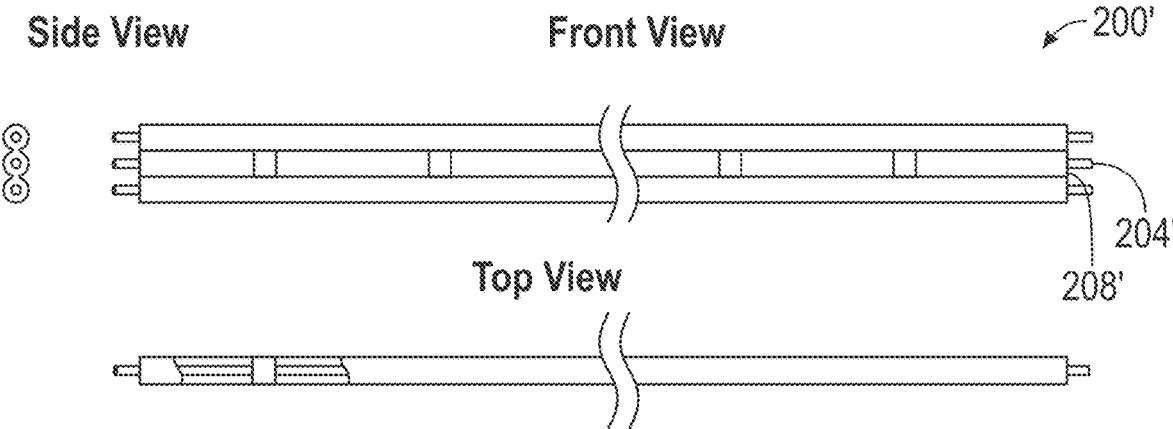
FIG. 2b, and 27-33 illustrate the exemplary steps in manufacturing three-wire flat cable high-voltage plug-in light strings, according to embodiments of the disclosure.

With reference to FIG. 2*b*, and 35-46, yet another embodiment is provided relating to methods for manufacturing high-voltage plug-in light strings utilizing a three-wire flat cable, distinct from those described in prior embodiments. In this embodiment, the manufacturing process begins by processing a three-wire flat cable in accordance with the step illustrated in FIG. 1. In this embodiment, as illustrated in FIG. 2*b*, the middle wire 204' of the three-wire flat cable 200' is cut and the PVC 208' is removed to expose the copper wire inside.

Figure 35:
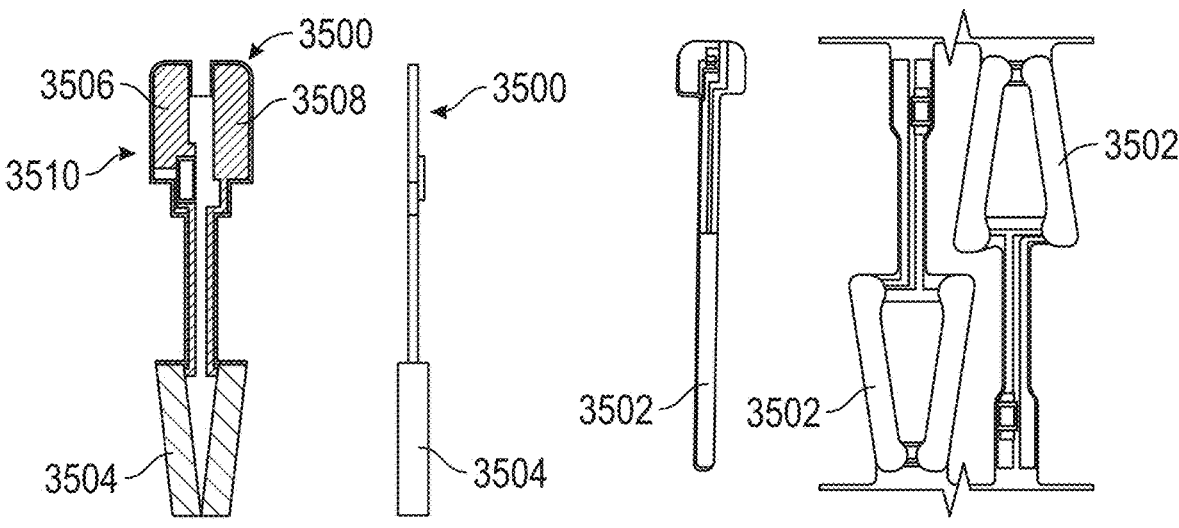
FIGS. 35-45 illustrate the exemplary steps in manufacturing three-wire flat cable high-voltage plug-in light strings, according to embodiments of the disclosure.

Following this, and as shown in FIG. 35, an SMD circuit board 3500 is provided. Multiple SMDs (not shown in FIG. 35) are mounted on a designated region 3504 of the circuit board 3500. Phosphor materials 3502 may be applied over the SMDs to generate different luminous patterns, as further illustrated in FIG. 35. The circuit board 3500 can include two exposed conductor contact patches 3506 and 3508 located at one end 3510 of the board.

Figures 36, 37:
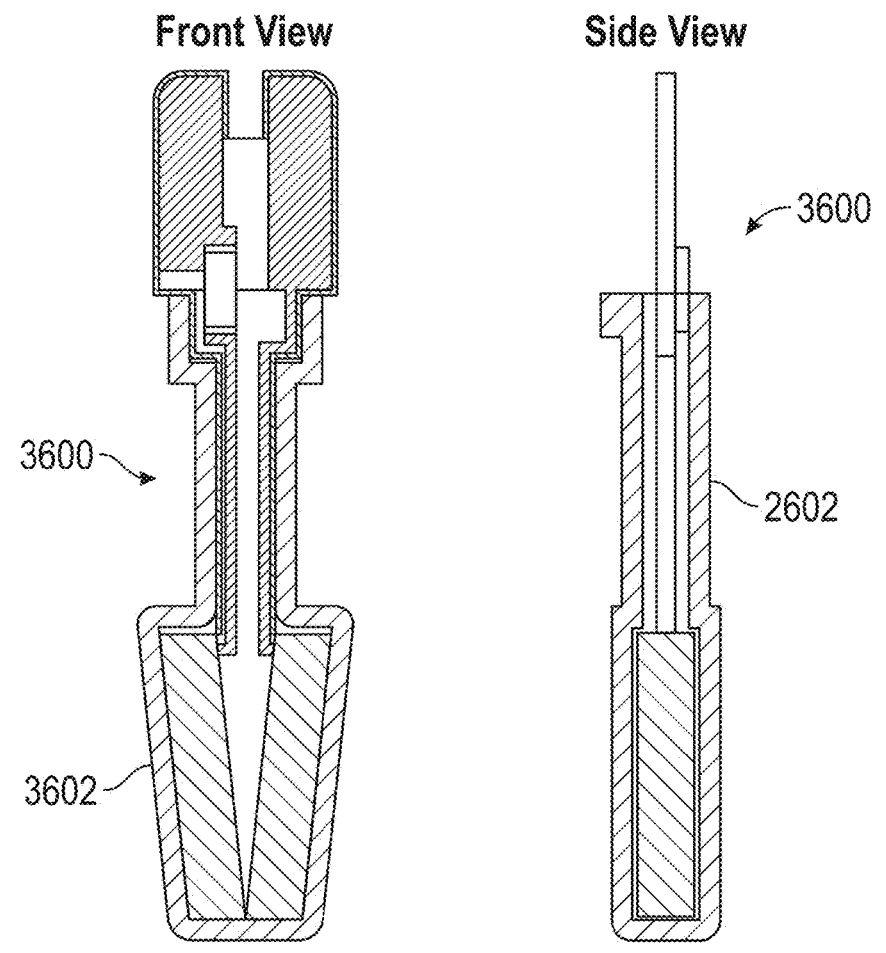

As illustrated in FIG. 36, the light-emitting SMD circuit board 3600 can then be enclosed within a transparent protective shell 3602. The transparent protective shell 3602 can protect the SMD circuit board 3600.

Referring to FIG. 37, the encapsulated circuit board 3700 (assembled as described in FIG. 36) can be mechanically coupled to connecting parts 3704. As shown in FIG. 37, an adhesive (e.g., glue) 3702 can be applied between the encapsulated circuit board 3700 and the connecting parts 3704 to seal the lower opening 3706 of the assembly, thereby achieving waterproofing.

Figure 38:
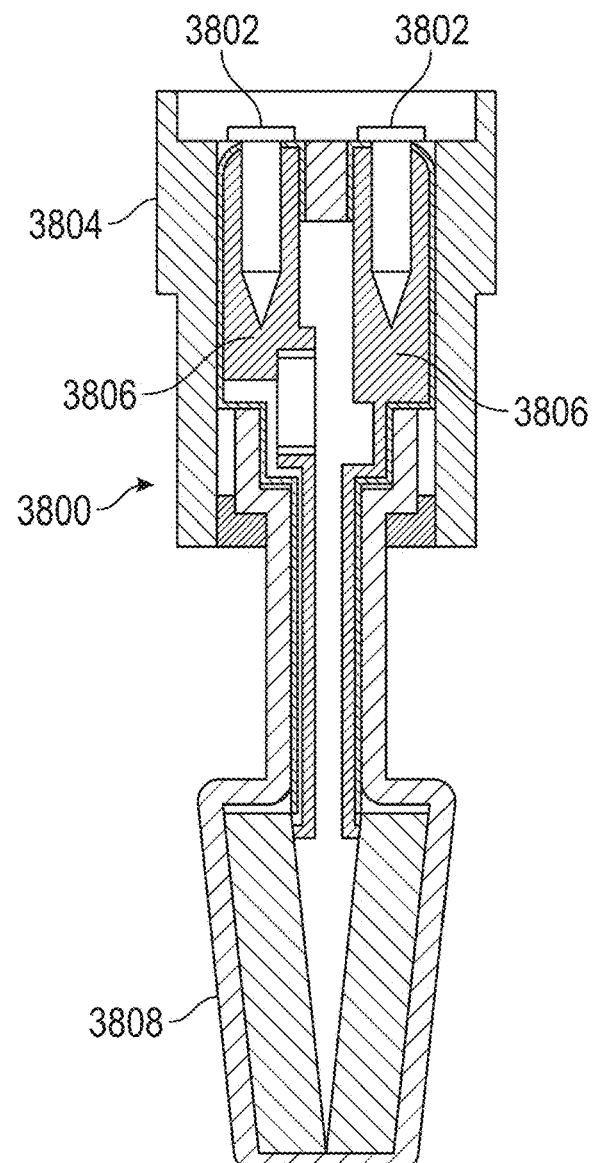
Figure 38:
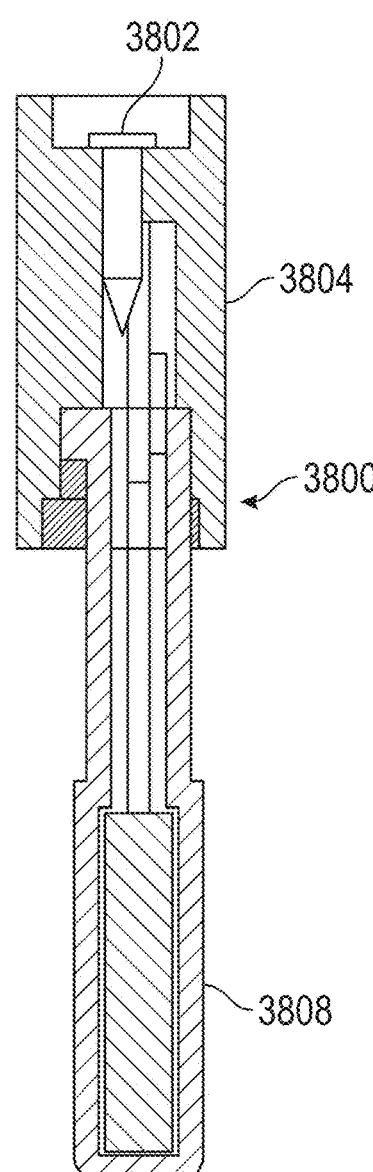
Figure 38:
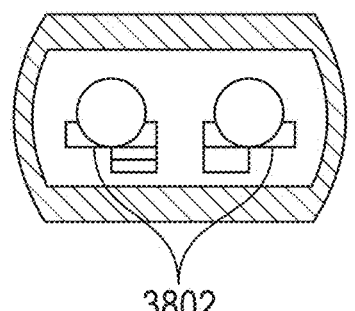

As shown in FIG. 38, the sub-assembly 3800 produced in FIG. 37 is further processed by inserting two metallic contact tips (collectively 3802) into corresponding bayonets in the connecting parts 3804. These metallic tips 3802 can be tightly connected to and establish firm electrical contact with corresponding conductors (collectively 3806) on the circuit board 3808.

Figure 39:
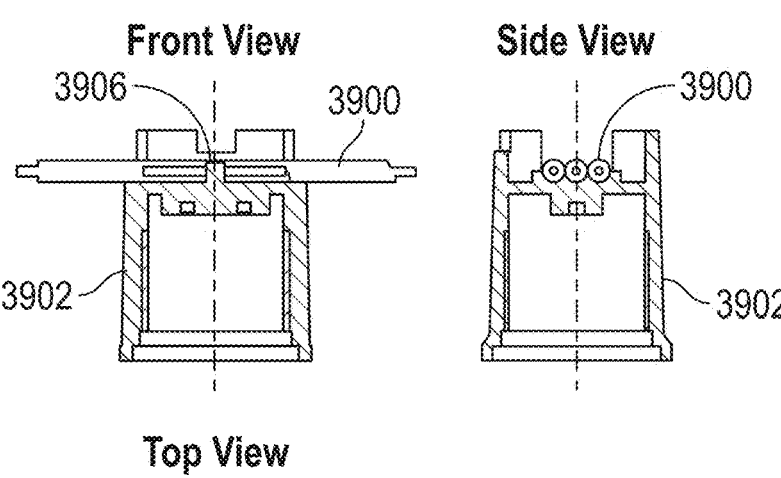
Figure 39:
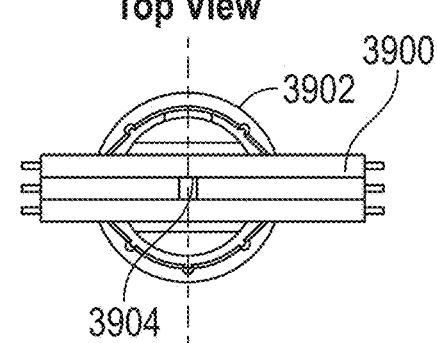

Next, as illustrated in FIG. 39, the previously prepared wire 3900 (processed per the procedure shown in FIGS. 1 and 2) is affixed to the top of a light holder 3902. A protruding feature 3906 of the light holder 3902 is configured to be wedged in the cutout or opening 3904 in the wire 3900, thereby affixing the wire 3900 to the light holder 3902.

Figure 40:
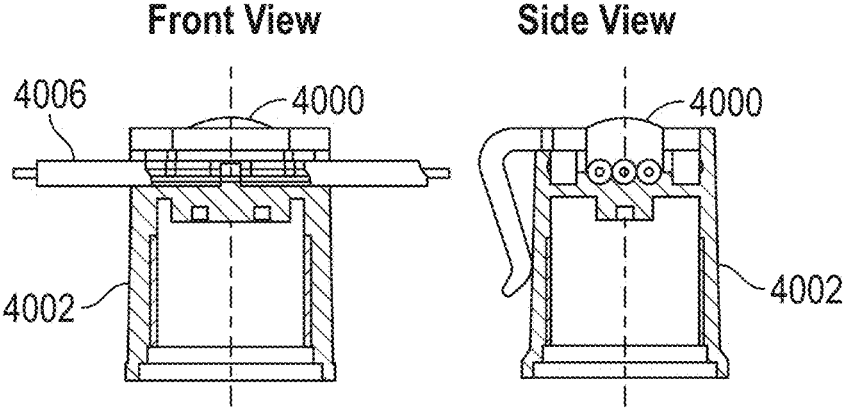
Figure 40:
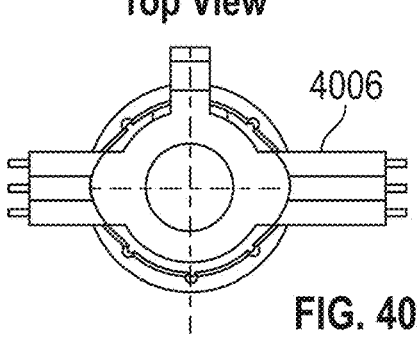

As shown in FIG. 40, a top cap 4000 can be clamped over the flat wire 4006 onto the light holder 4002, forming a tight enclosure through which the flat wire 4006 passes. The top 4000 cap can be made of plastic.

Figure 41:
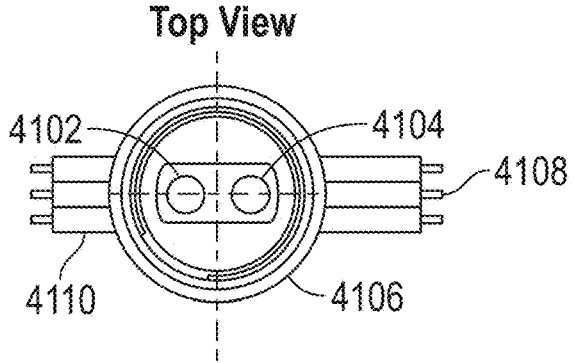
Figure 41:
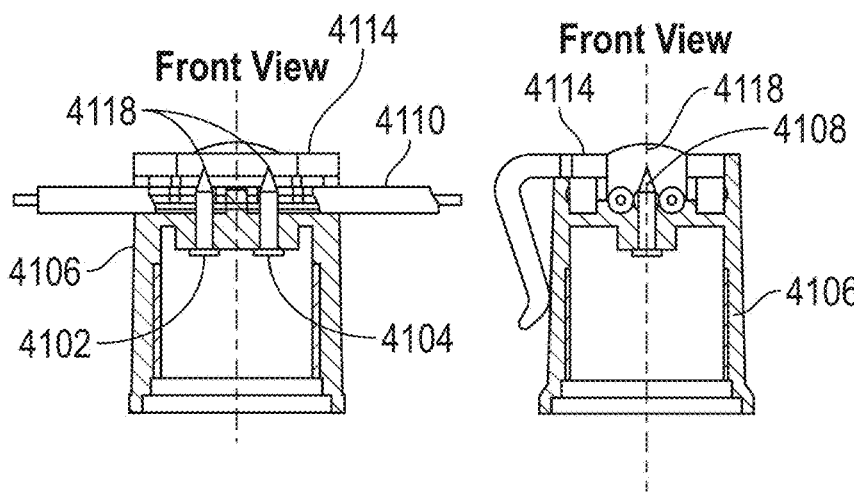

Referring now to FIG. 41, two metal nails 4102, 4104 can be installed into designated insertion points on the light holder 4106. These metal nails can penetrate through the light holder 4106, reaching the middle wire 4108 of the three-wire cable 4110, establishing electrical contact with the exposed copper strands of the middle wire 4108. The tips 4118 of the metal nails 4102, 4104 can drill into the plastic top cap 4114, further securing the light holder 4106 and the top cap 4114.

Figure 42:
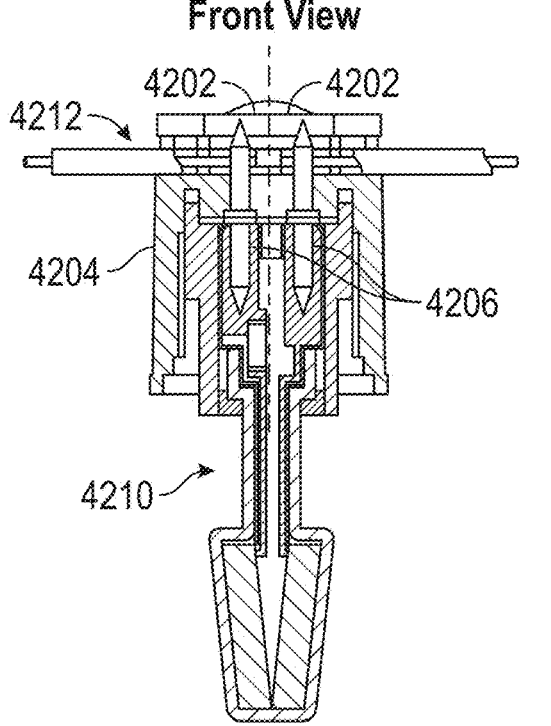
Figure 42:
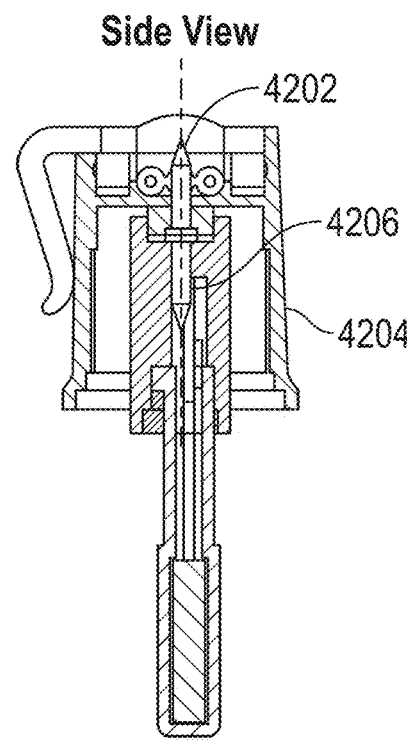

As shown in FIG. 42, the SMD circuit board assembly 4210 of FIG. 38 can be electrically and mechanically coupled with the three-wire cable assembly 4212 of FIG. 41. Electrical conduction is achieved by aligning and putting the metal nails 4202 extending through the light holder 4204 in contact with the metal nails 4206 in the circuit board assembly.

Figure 43:
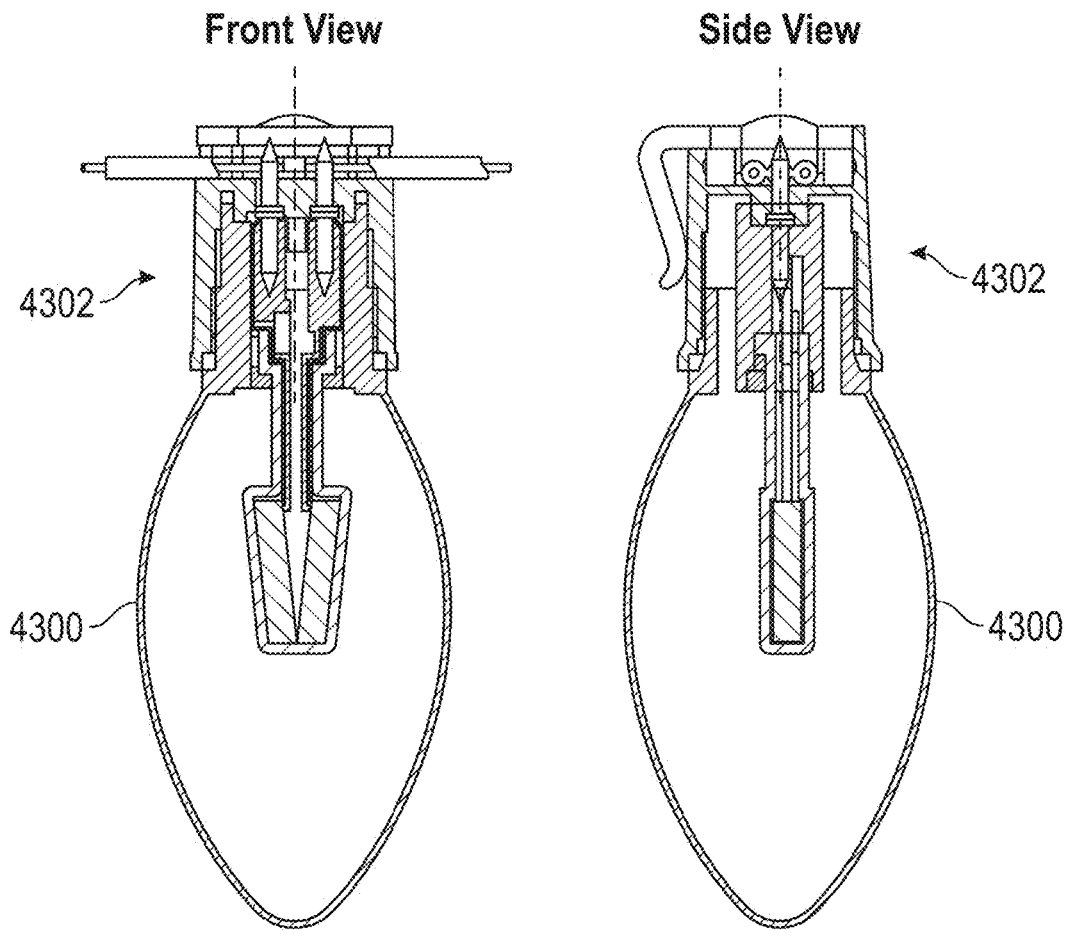

In the subsequent step illustrated in FIG. 43, a decorative light shell 4300 of selected design is installed over the assembled light structure 4302 to provide aesthetic customization.

Figure 44:
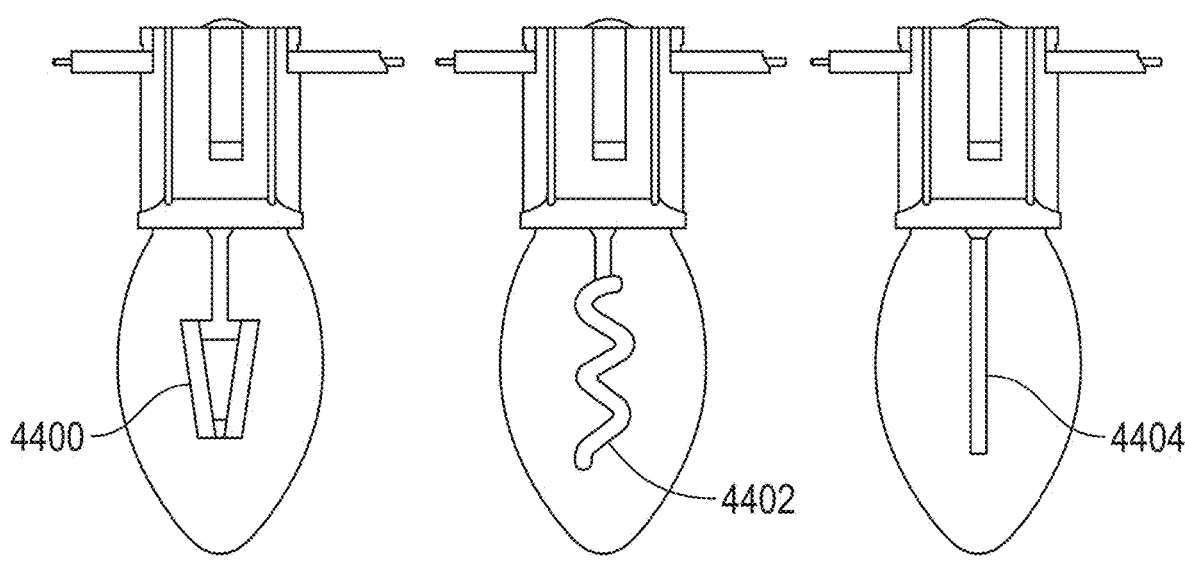

As illustrated in FIG. 44, the circuit board may be fabricated in various shapes, including 4400, 4402, and 4404, to simulate different filament lighting effects within the finished product.

Figure 45:
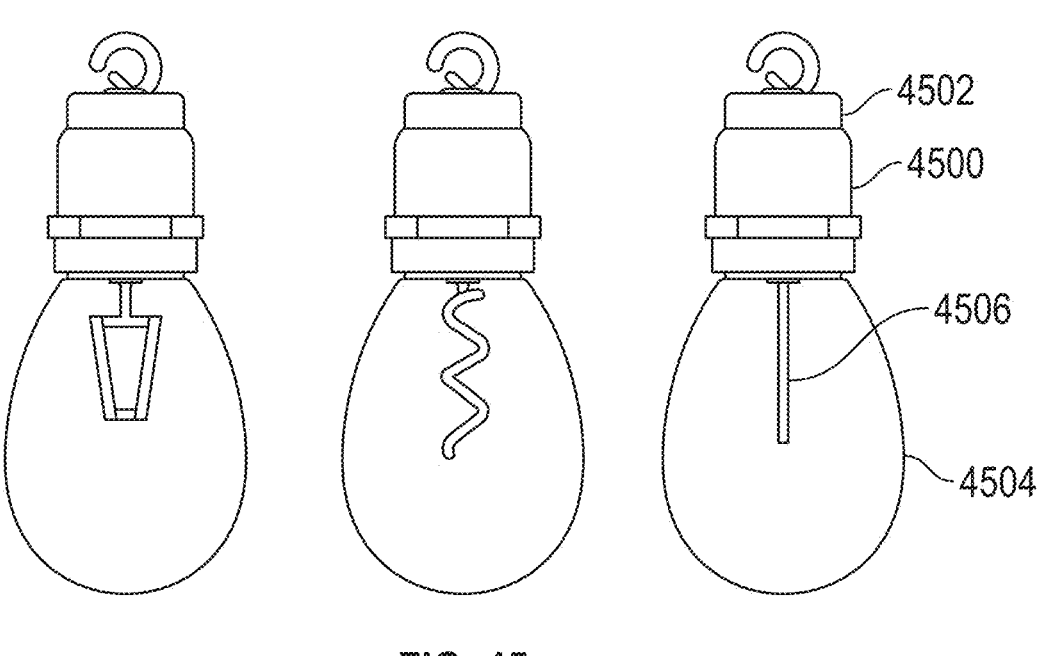

Additionally, as shown in FIG. 45, the overall appearance of the light string may be varied by selecting different configurations of light holders 4500, light covers 4502, decorative shells 4504, and SMD circuit boards 4506, each having distinct shapes and/or dimensions.

Figure 46:
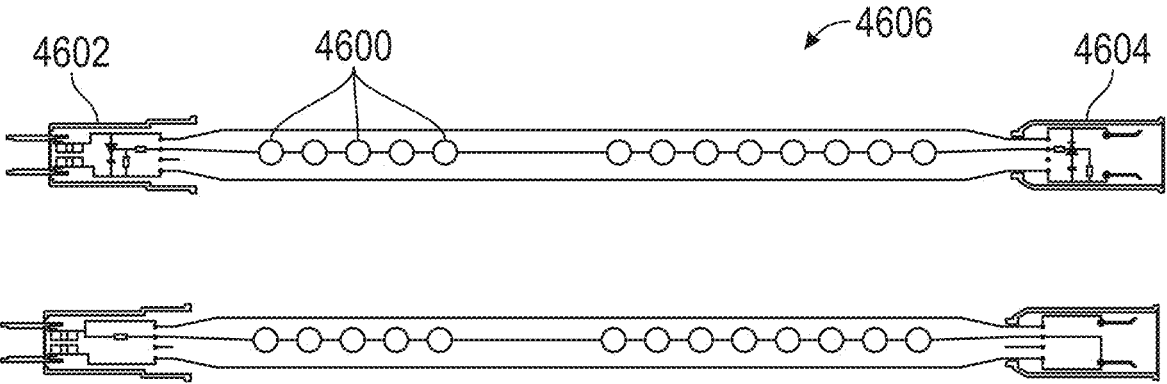
FIG. 46 is a schematic diagram of an exemplary circuit of a light string, according to an embodiment of the disclosure.

Finally, as illustrated in FIG. 46, multiple SMD circuit boards, collectively 4600, may be connected in series. These circuit boards are electrically linked via front and rear plugs 4602 and 4604 to form a continuous and operational light string assembly 4606.

With reference to FIGS. 1, 2A, and 47-59, yet another embodiment is provided relating to methods for manufacturing high-voltage plug-in light strings utilizing a three-wire flat cable, distinct from those described in prior embodiments. In this embodiment, the manufacturing process begins by processing a three-wire flat cable in accordance with the step illustrated in FIGS. 1 and 2A. As illustrated in FIG. 2b, the middle wire 204' of the three-wire flat cable 200' is cut and the PVC 208' is removed to expose the copper wire inside.

Figure 47:
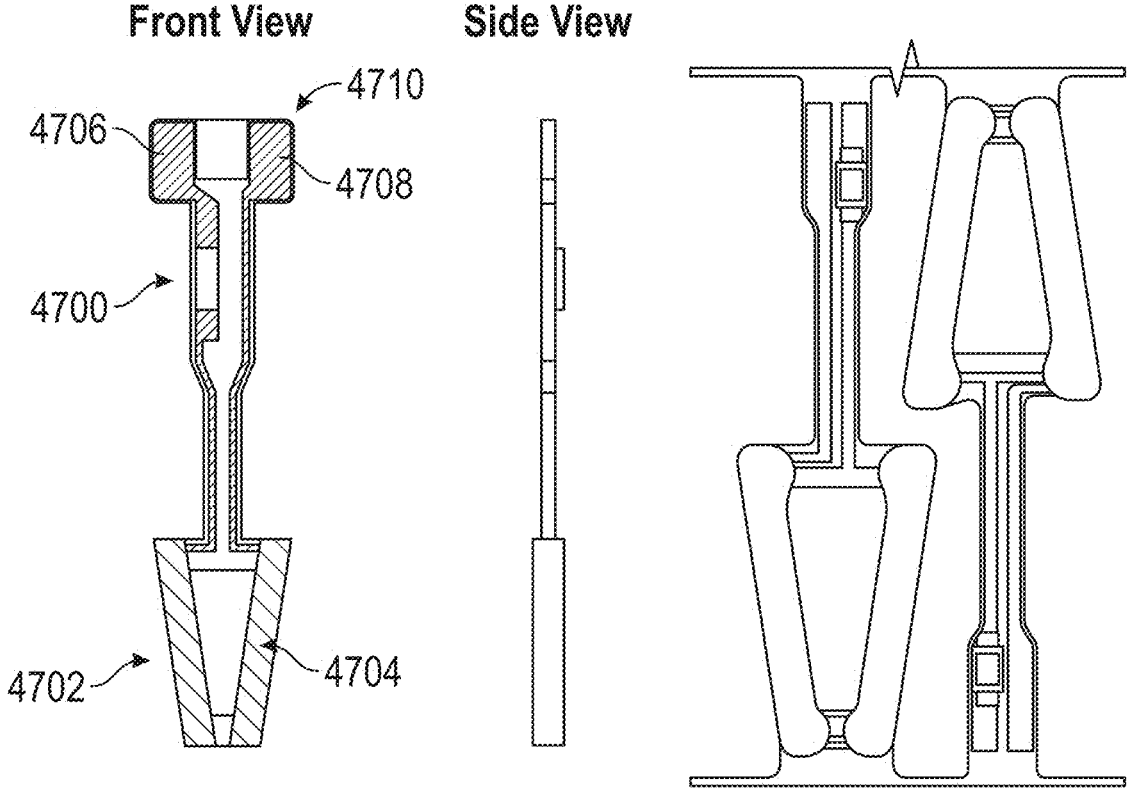
FIGS. 47-56 illustrate the exemplary steps in manufacturing three-wire flat cable high-voltage plug-in light strings, according to embodiments of the disclosure.

Next, as illustrated in FIG. 47, a circuit board 4700 is provided with multiple SMDs (not shown in FIG. 47) attached to the designated positions 4702 of circuit board 4700. Phosphor materials 4704 may be applied over the SMDs to generate different luminous patterns. The circuit board 4700 can include two exposed conductor contact patches 4706 and 4708 located at one end 4710 of the circuit board 4700.

Figure 48:
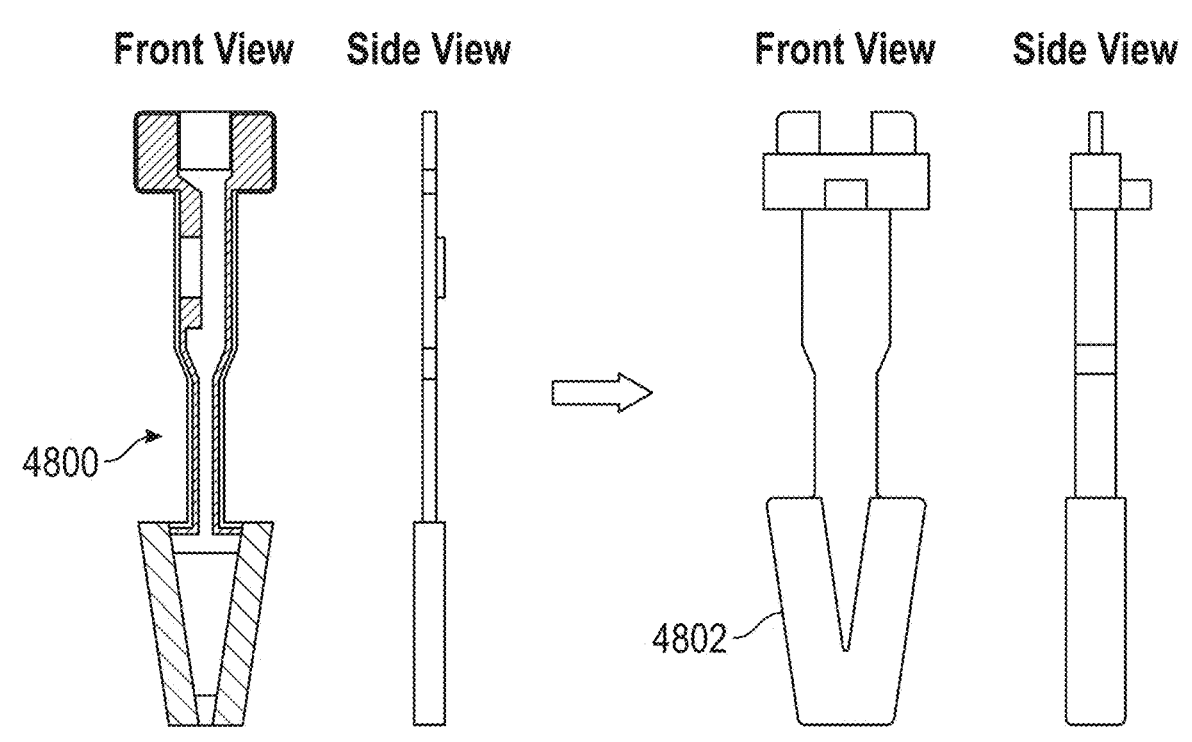

As shown in FIG. 48, the luminous circuit board 4800 of FIG. 47 is then wrapped with a transparent shell 4802 to protect the circuit board 4800.

Figure 49:
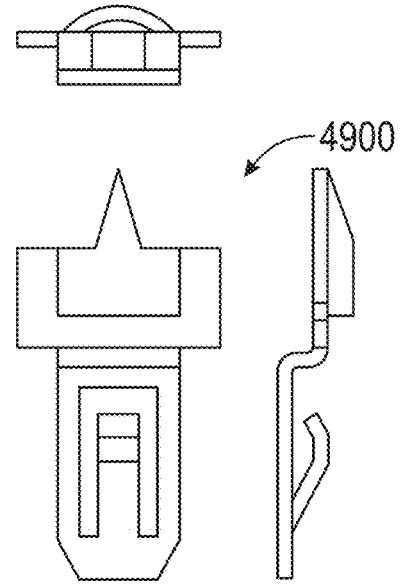
Figure 49:
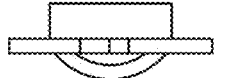

In this embodiment, a piercing copper terminal 4900 shown in FIG. 49 can be provided. Two piercing copper sheets 5000, 5002 can then be fitted in a light holder 5004 as shown in FIG. 50 with their piercing tips 5006, 5008, protruding from a recess 5010 at the top of the light holder 5004, the recess 5010 formed between two protrusions 5012, 5014.

Figures 50, 51:
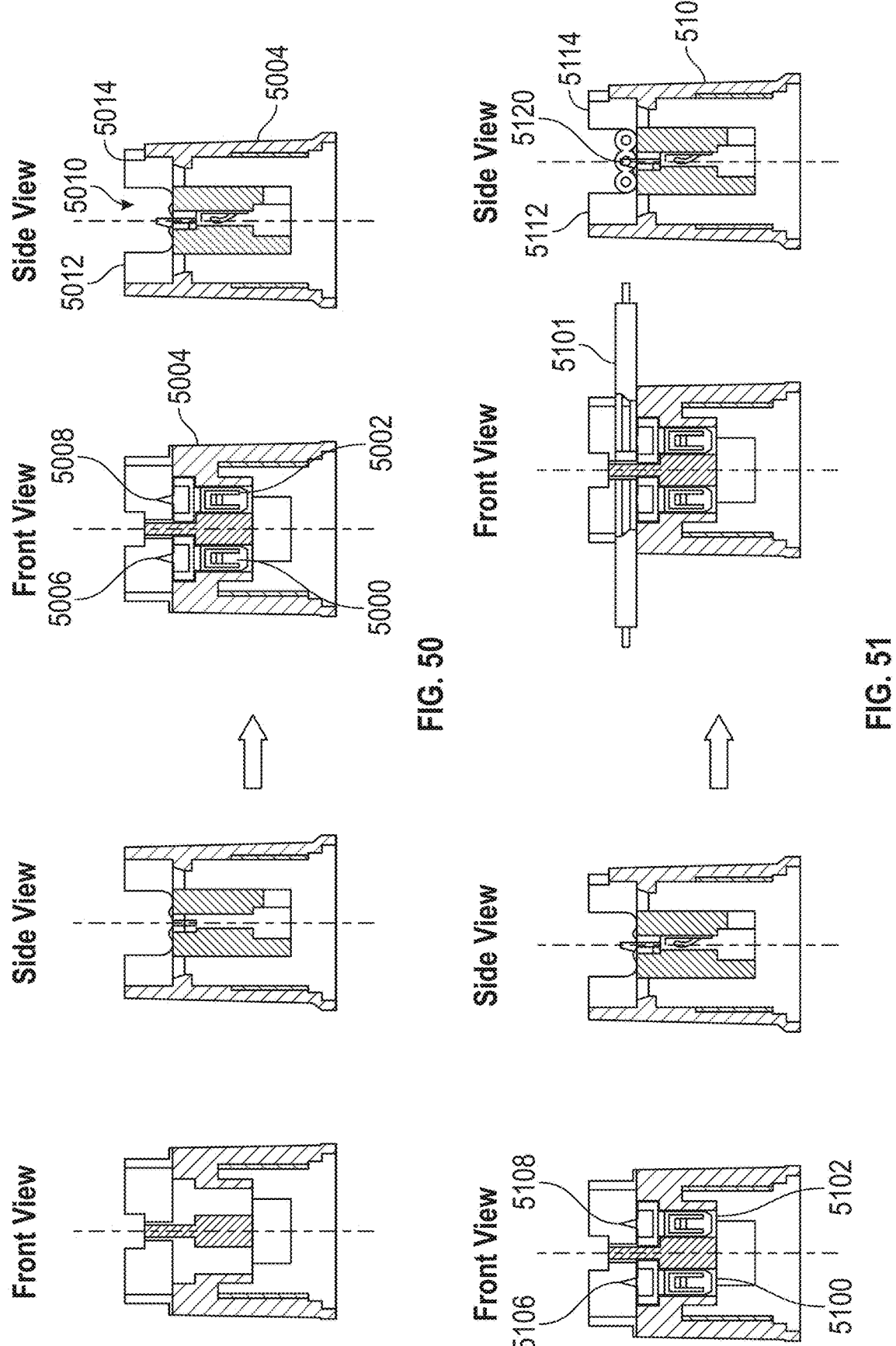

Next, as shown in FIG. 51, the flat wire 5101—processed as illustrated in FIG. 2A—is positioned between the two protrusions 5112 and 5114 at the top of the light holder 5104, such that the piercing tips 5106, 5108 of the copper piercing sheets 5100, 5102 are inserted into the region where the middle wire 5120 of the flat wire 5101 has been severed.

Figures 52, 53:
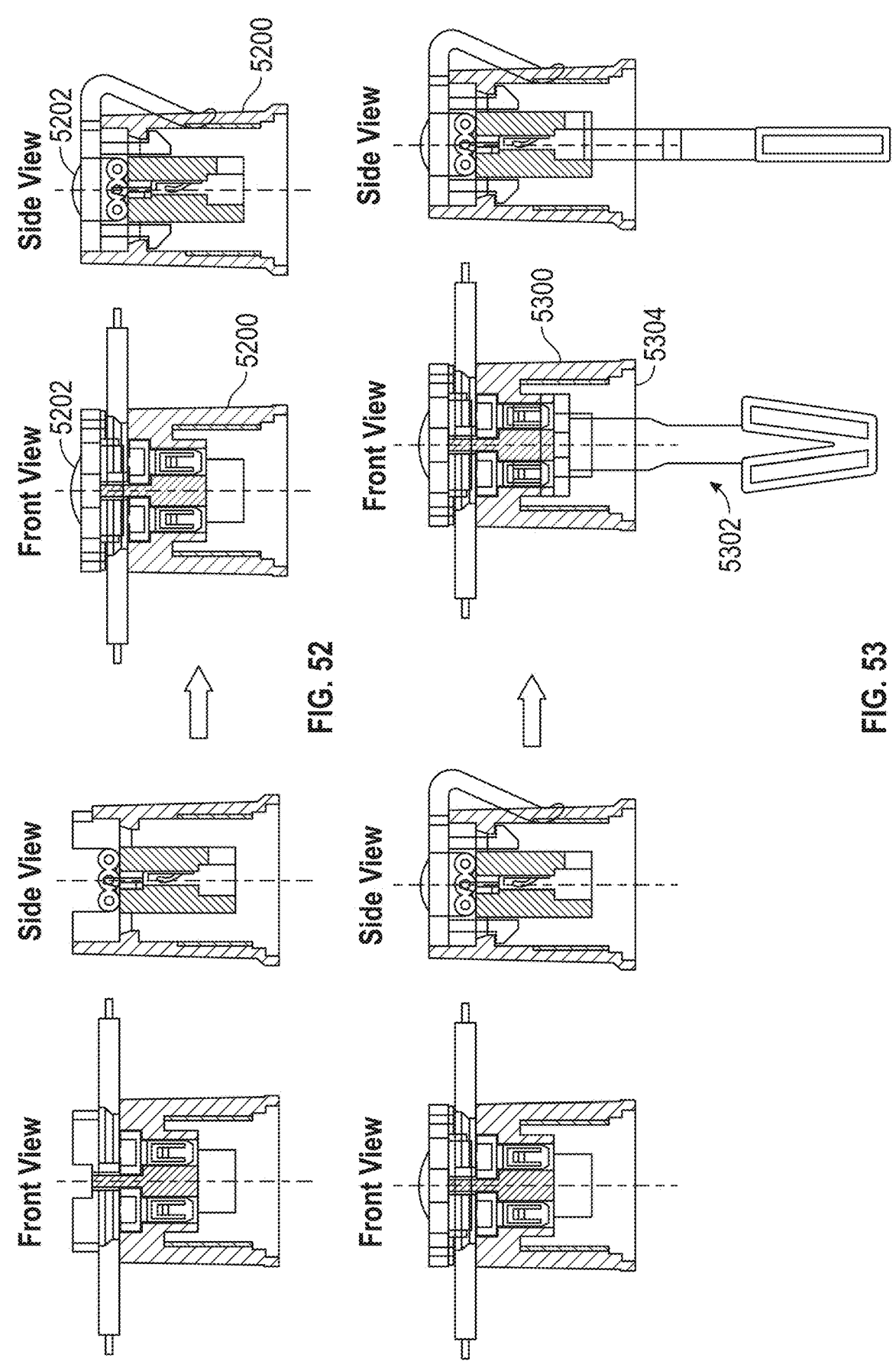

As shown in FIG. 52, a cap 5202 can be installed on top of the light holder 5200. The cap 5202 can be clamped onto the light holder 5200 to form a tight fit.

Next, as shown in FIG. 53, the circuit board assembly 5302 of FIG. 48 is inserted through the bottom opening 5304 of the light holder 5300 and locked into a predetermined location within the light holder 5300.

Figure 54:
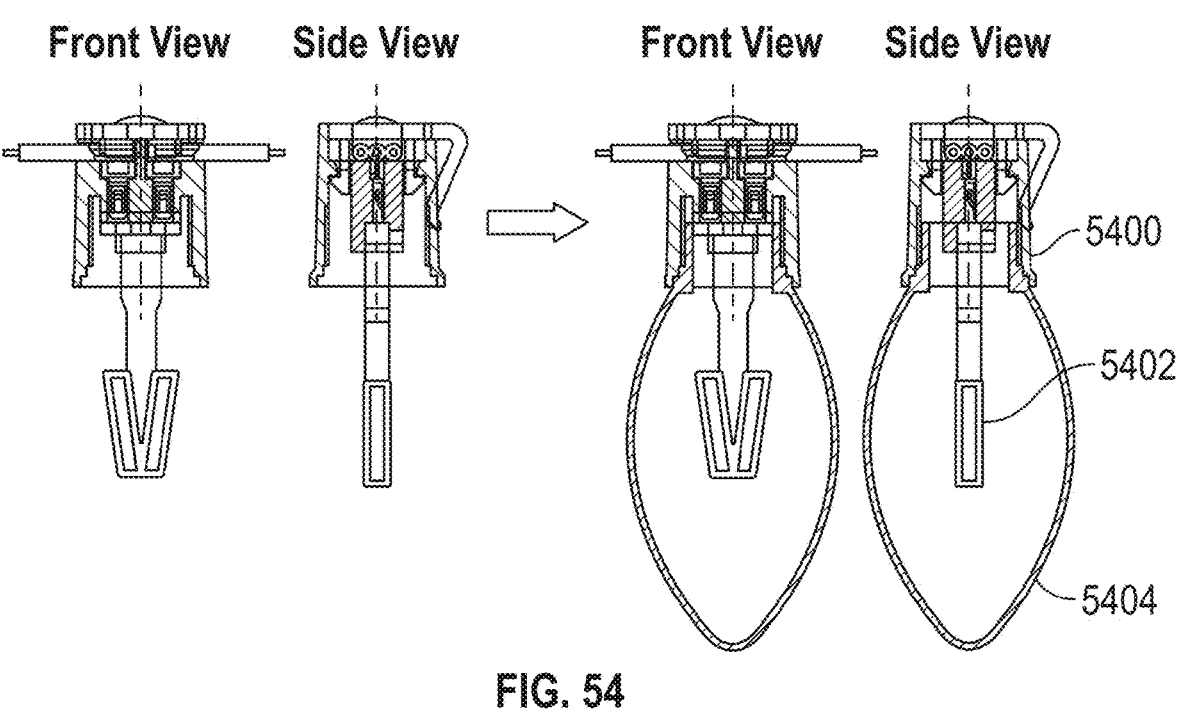

A decorative shell 5404 enclosing the circuit board assembly 5402 can then be secured onto the light holder 5400, as illustrated in FIG. 54.

Figure 55:
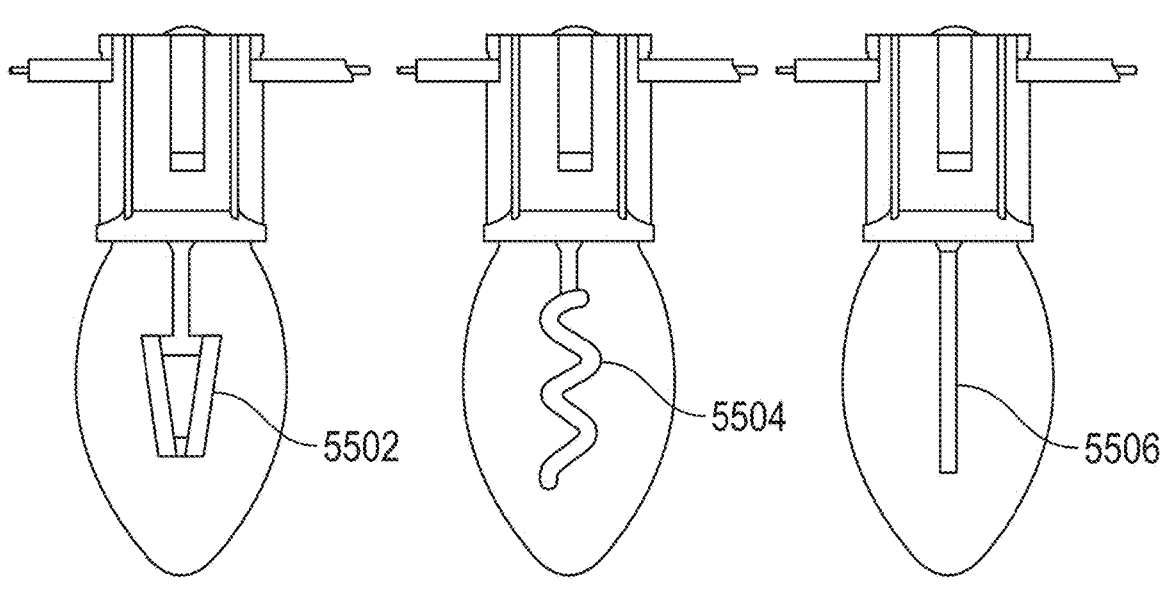

As illustrated in FIG. 55, the circuit board 5500 can be made into various shapes 5502, 5504, 5506 in various embodiments to create different filament effects.

Figure 56:
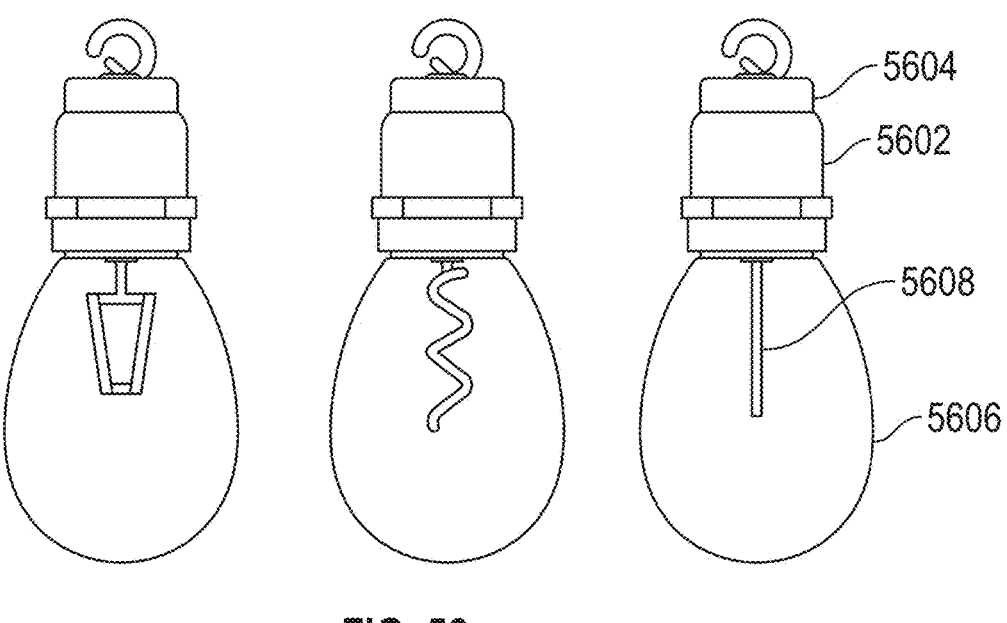

In addition, the shape and size of the light head 5602, light head cover 5604, decorative shell 5606, and/or SMD circuit board 5608 may vary in different embodiments, as shown in FIG. 56.

Figure 57:
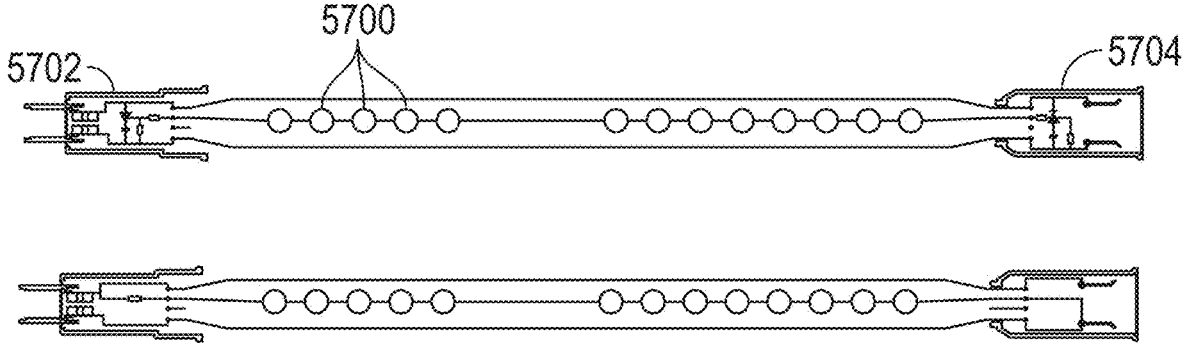
FIGS. 57 and 58 are schematic diagrams of exemplary circuits of a light string, according to embodiments of the disclosure.

Finally, as illustrated in FIG. 57, multiple SMD circuit boards, collectively 5700, may be connected in series. These circuit boards 5700 are electrically linked via front and rear plugs 5702 and 5704 to form a continuous and operational light string assembly 5706.

Figure 58:
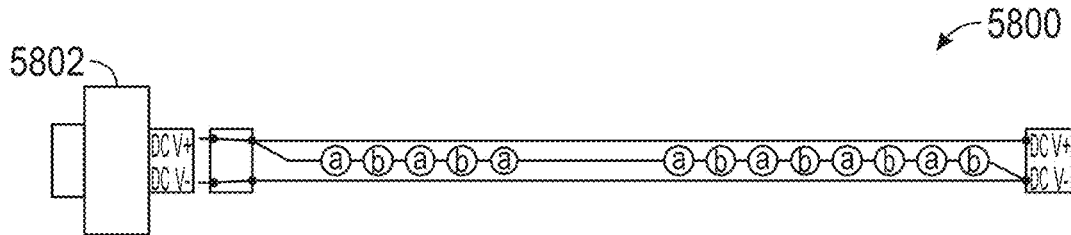
Figure 58:
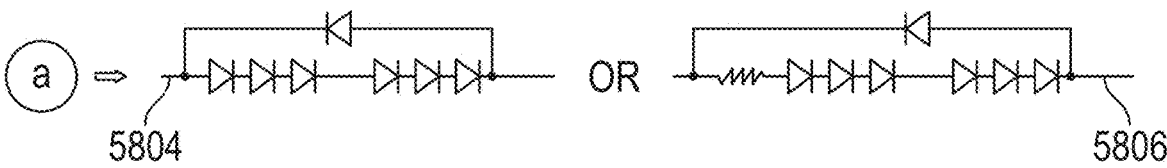
Figure 58:
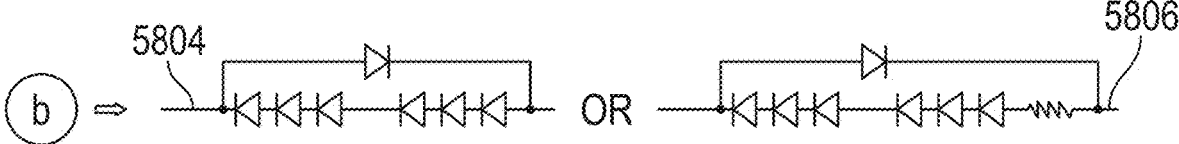

FIG. 58 illustrates exemplary circuit diagrams of alternative embodiments, in which the light string 5800 is connected to a controller 5802. The embodiment of FIG. 58 can enable parallel two-way multifunctional control using three-wire series-parallel configurations 5804, 5806.

Figure 59:
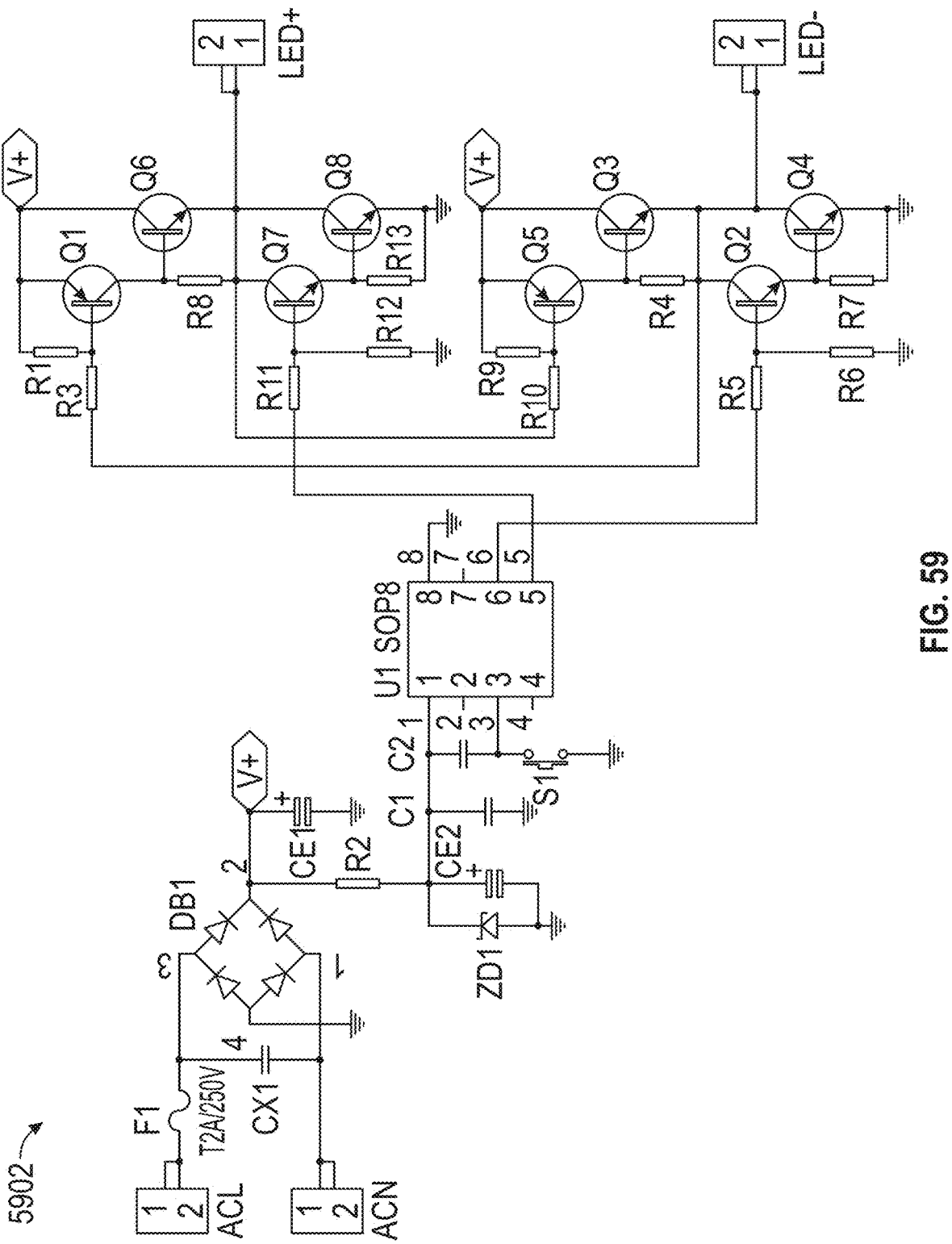
FIG. 59 is an exemplary circuit diagram of the controller of FIG. 58, according to an embodiment of the disclosure.

FIG. 59 illustrates an exemplary circuit diagram of the controller 5902 of the embodiment of FIG. 58. The controller 5902 can control two luminous circuit boards a and b to provide two-way multifunctional control.

Although the steps in the above embodiments are described in certain order, it should be understood that some of these steps in these embodiments can be performed simultaneously or in an order different to the ones described above.

Although embodiments of this disclosure have been fully described with reference to the accompanying drawings, it is to be noted that various changes and modifications will become apparent to those skilled in the art. Such changes and modifications are to be understood as being included within the scope of embodiments of this disclosure as defined by the appended claims.

What is claimed is:

1. A method of making a light string comprising:
providing a three-wire flat cable comprising a middle wire between two outer wires;
cutting the middle wire at a first place to expose a first end and a second end of the middle wire;
mounting a plurality of light sources onto a predetermined region of a circuit board, the circuit board comprising a first and a second exposed conductor contact pads positioned at a terminal end of the circuit board;
applying phosphor materials over the mounted light sources to create a luminous pattern;
enclosing the circuit board in an encapsulation shell;
fitting a light base over the terminal end of the circuit board enclosed in the encapsulation shell;
solder the first end and second end of the middle wire to the first and the second exposed conductor contact pads, respectively;
placing a light cover over the circuit board;
affixing the light cover to a light base; and
securing a decorative shell to a base portion of the light base to form a complete light assembly.

2. The method of claim 1, further comprising sealing a terminal end of the transparent encapsulation shell using a plug or an adhesive compound.

3. The method of claim 1, wherein the light base is affixed to the terminal end of the encapsulated circuit board using an adhesive.

4. The method of claim 1, wherein the circuit board is fabricated in one of a plurality of geometric configurations.

5. The method of claim 1, wherein the plurality of light sources comprise Surface Mount Devices (SMDs).

6. A method of making a light string comprising:
providing a three-wire flat cable comprising a middle wire between two outer wires;
cutting the middle wire at a first place to expose copper strands of the middle wire;
mounting a plurality of light sources on a circuit board, the circuit board comprising a first and a second exposed conductor contact patches located at a first end of the circuit board;
applying phosphor materials over the mounted light sources to create a luminous pattern;
enclosing the circuit board in a protective shell;
coupling the enclosed circuit board with connecting parts;
inserting two metallic contact tips into corresponding bayonets in the connecting parts such that each of the two metallic contact tips are in electrical contact with one of the first and second exposed conductor contact patches;
affixing the three-wire flat cable onto a light holder;
clamping a top cap over the three-wire flat wire onto the light holder, forming an enclosure through which the three-wire flat wire passes;
installing a first and a second metal nails into designated insertion points on the light holder such that the first and second metal nails penetrate through the light holder, reaching the middle wire of the three-wire cable and establishing electrical contact with the exposed copper strands of the middle wire; and
aligning and pushing the first and second metal nails through the light holder to be in contact with the first and second metallic contact tips, respectively.

7. The method of claim 6, further comprising applying an adhesive between the encapsulated circuit board and the connecting parts to seal an opening between the encapsulated circuit board and the connecting parts.

8. The method of claim 6, wherein affixing the three-wire flat cable onto a light holder comprises having a protruding feature of the light holder wedged in the first space of the middle wire.

9. The method of claim 6, further comprising drilling tips of the first and second metal nails into the top cap.

10. The method of claim 6, further comprising installing a decorative light shell over the enclosed circuit board.

11. The method of claim 10, wherein the plurality of light sources comprise Surface Mount Devices (SMDs).

\*  \*  \*  \*  \*